(12) United States Patent
Chidambarrao et al.

(10) Patent No.: US 7,060,539 B2
(45) Date of Patent: Jun. 13, 2006

(54) METHOD OF MANUFACTURE OF FINFET DEVICES WITH T-SHAPED FINS AND DEVICES MANUFACTURED THEREBY

(75) Inventors: Dureseti Chidambarrao, Weston, CT (US); Omer Dokumaci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 10/790,550

(22) Filed: Mar. 1, 2004

(65) Prior Publication Data

US 2005/0191795 A1    Sep. 1, 2005

(51) Int. Cl.
*H01L 21/335*    (2006.01)
*H01L 21/8232*   (2006.01)

(52) U.S. Cl. ..................... 438/142; 438/173
(58) Field of Classification Search ............... 438/142, 438/156, 157, 173, 192
See application file for complete search history.

(56) References Cited

U.S. PATENT DOCUMENTS

| | | | |
|---|---|---|---|
| 6,252,284 B1 | 6/2001 | Muller et al. | 274/412 |
| 6,352,872 B1 | 3/2002 | Kim et al. | 438/24 |
| 6,391,695 B1 | 5/2002 | Yu | 438/166 |
| 6,413,802 B1 | 7/2002 | Hu et al. | 438/151 |
| 6,429,061 B1 | 8/2002 | Rim | 438/198 |
| 6,433,609 B1 | 8/2002 | Voldman | 327/313 |
| 6,583,015 B1 | 6/2003 | Fitzgerald | 438/287 |
| 6,583,469 B1 | 6/2003 | Fried et al. | 257/329 |
| 6,603,156 B1 | 8/2003 | Rim | 257/190 |
| 6,610,576 B1 | 8/2003 | Nowak | 438/301 |
| 6,611,029 B1 | 8/2003 | Ahmed et al. | 257/365 |
| 6,635,909 B1 | 10/2003 | Clark et al. | 257/192 |
| 6,642,090 B1 | 11/2003 | Fried et al. | 438/164 |

(Continued)

OTHER PUBLICATIONS

Wong et al. "Self-Aligned (Top and Bottom) Double-Gate MOSFET with a 25nm Thick Silicon Channel, IEDM pp. 97-427 to 430, pp. 16.6.1-16.6.4", 1997 IEEE.

(Continued)

*Primary Examiner*—Phuc T. Dang
(74) *Attorney, Agent, or Firm*—Graham S. Jones; H. Daniel Schnurmann

(57) ABSTRACT

An FET device with a source island and a drain island is formed on a horizontal surface of a substrate comprising an insulating material. A channel structure formed over the horizontal surface of the substrate, which connects between the drain and the source, comprises a planar semiconductor channel fin formed above a vertical fin. The planar and vertical fins form a T-shaped cross-section. The bottom of the vertical fin contacts the horizontal surface of the substrate and the planar fin contacts the top of the vertical fin. A gate dielectric layer covers exposed surfaces of the channel structure. A gate electrode straddles the channel gate dielectric and the channel structure. A sacrificial layer, e.g. SiGe, deposited upon the substrate before forming the vertical fin, may be a semiconductor or dielectric material. The planar fin comprises a semiconductor material such as Si, SiGe or Ge.

20 Claims, 16 Drawing Sheets

U.S. PATENT DOCUMENTS

| | | | |
|---|---|---|---|
| 6,642,536 B1 | 11/2003 | Xiang et al. | 257/19 |
| 6,657,252 B1 | 12/2003 | Fried et al. | 257/316 |
| 6,657,259 B1 | 12/2003 | Fried et al. | 257/350 |
| 6,662,350 B1 | 12/2003 | Fried et al. | 716/11 |
| 6,664,582 B1 | 12/2003 | Fried et al. | 257/308 |
| 2003/0227036 A1 | 12/2003 | Sugiyama et al. | 257/288 |
| 2004/0007715 A1 | 1/2004 | Webb et al. | 257/192 |
| 2004/0197975 A1* | 10/2004 | Krivokapic et al. | 438/200 |

OTHER PUBLICATIONS

Leobandung et al. "Wire-channel and Wrap-Around-Gate Metal-Oxide-Semiconductor Field-Effect Transistors with a Significant Reduction of Short Channel Effects", J. Vac. Sci Technol. B 15 (6), Nov./Dec. 1997 American Vacuum Society, pp. 2791-2794.

Huang et al. "Sub 50-nm FinFET: PMOS" 1999 IEEE, IEDM 99-67 to 70, pp. 3.4.1 to 3.4.4, 1999 IEEE.

Huang et al. "Sub 50-nm FinFET" IEEE Transactions on Electron Devices, vol. 48, No. 5 May 2001, pp. 880-886, 2001 IEEE.

Tezuka et al. "High-performance Strained Si-on-Insulator MOSFETs by Novel Fabrication Processes Utilizing Ge-Condensation Technique", 2002 Symposium On VLSI Technology Digest of Technical Papers, 10.3, pp. 96-97, 2002 IEEE.

* cited by examiner

METHOD OF MANUFACTURE OF FINFET DEVICES WITH T-SHAPED FINS AND DEVICES MANUFACTURED THEREBY

BACKGROUND OF THE INVENTION

This invention relates generally to Field Effect Transistor (FET) and Metal-Oxide-Semiconductor Field Effect Transistor (MOSFET) devices, and more particularly to FinFET devices having channels comprising fins formed above a supporting substrate and extending between horizontally disposed source and drain regions which are also formed above the supporting substrate.

As has been the trend in the past, continued improvement in the performance of FET devices can be achieved by "scaling" those devices to smaller sizes to increase device speed.

Whereas the conventional FET device had a single gate electrode, recently double gate structures have been developed which form a gate on both sides of the body or channel of the FET. The double gate structure permits better current and short channel control in a device with smaller space requirements on the surface of a semiconductor.

FinFET devices are double gate FET devices with a vertical fin which forms the channel of the FET and with double gates formed on either side of the fin which may be separate or which may be interconnected to function as a single gate electrode.

U.S. Pat. No. 6,611,029 of Ahmed et al entitled "Double Gate Semiconductor Device Having Separate Gates" describes a FinFET device with two separate, independent gate electrodes formed on opposite sides of the fin. The device comprises a Silicon-On-Insulator (SOI) FET device. In SOI devices a layer of silicon overlies a substrate composed of an insulator such as silicon dioxide.

U.S. Pat. No. 6,413,802 of Hu et al for "FinFET Transistor Structures Having a Double Gate Channel Extending Vertically From a Substrate and Methods of Manufacture" describes a single or multiple fin FinFET device formed over an insulative layer. A vertical channel fin which is formed over the insulative layer is covered by a gate oxide layer. A double gate electrode extends across the channel fin. The device is formed by etching away portions of the silicon layer of a SOI structure to form the source drain islands and the vertical fin which connects the source/drain islands together. The double gate provides enhanced drive current and effectively suppresses short channel effects. A plurality of parallel fins is shown connecting between the source and the drain for increased current capacity, with a double gate structure straddling all of the parallel channel fins.

The Hu et al. patent described the FinFET art in the following paragraphs. Huang et al. "Sub-50 nm FinFET PMOS" IEDM Tech. Dig., pp. 75–78 (1999), Huang et al. "Sub-50 nm P-Channel FinFET" IEEE Transactions on Electron Devices, VOL. 48, No. 5, pp. 880–886 (May 2001) describe FinFET devices. Wong et al. "Self-Aligned (Top and Bottom) Double Gate MOSFET with a 25 nm Thick Silicon Channel", IEDM 97-427-430, 16.6.1–16.6.4 (1997 IEEE) describes a double gate MOSFET with the gate electrode formed above and below a thin silicon channel.

Leobandung et al. "Wire-channel and wrap-around gate metal-oxide-semiconductor field-effect transistors with a significant reduction of short channel effects" J. Vac. Sci. Technol. B 15(6), pp. 2791–2794 (November/December 1997) describes a MOSFET with a wire channel patterned by Electron Beam Lithography (EBL) suspended between the source and the drain before formation of the gate electrode. Then an 11 nm thick gate oxide is formed followed by formation of a gate electrode deposited by LPCVD. Then the gate was patterned by a second EBL step followed by a Reactive Ion Etching (RIE) step.

U.S. Pat. No. 6,610,576 of Nowak entitled "Method for Forming Asymmetric Dual Gate Transistor" describes asymmetric doping of dual gates which are asymmetric in size.

U.S. Pat. No. 6,583,469 of Fried et al. entitled "Self-Aligned Dog-Bone Structure for FinFET Applications and Methods to Fabricate the Same" describes a structure with a FinFET channel and source/drain regions which are tapered in width to reduce gate to source/drain capacitance.

U.S. Pat. No. 6,475,869 of Yu entitled "Method of Forming a Double Gate Transistor Having an Epitaxial Silicon/Germanium Channel Region" describes a FinFET device with a vertical channel fin composed of silicon lined on sidewalls with SiGe formed on a BOX layer. The channel fin is capped by layer of silicon nitride. The gate electrode surrounding three sides of the channel fin.

U.S. Pat. No. 6,635,909 of Clark et al. entitled "Strained Fin FETs Structure and Method" describes a Fin FET structure in which a vertical fin formed on an insulator with a central portion composed of SiGe and Si and end portions composed of Si whereby the SiGe produces strain within the central portion creates strain to enhance carrier mobility.

SUMMARY OF THE INVENTION

In accordance with this invention a process is provided for fabricating T-cross section Fin (T-Fin) FET transistor structures with either combined horizontal/vertical fins or horizontal elevated fins.

Further in accordance with the invention a T-Fin FET transistor is formed of either combined horizontal/vertical channels or horizontal elevated channels.

In accordance with this invention, a method is provided for fabricating an FET device by the following steps. Form a semiconductor structure comprising a source region, a drain region over a horizontal surface of a substrate comprising an insulating material. Form a channel structure over the horizontal surface of the substrate connecting between the drain region and the source region, with the channel structure comprising a horizontally extending, semiconductor, planar channel fin formed above a vertical fin with the planar and vertical fins having a T-shaped cross-sections. The vertical fin has a proximal edge and a distal edge, with the proximal edge in contact with the horizontal surface of the substrate and with the planar fin in contact with the distal edge of the vertical fin. Form a gate dielectric layer over exposed surfaces of the channel structure. Then form a gate electrode straddling the channel gate dielectric and the channel structure.

Preferably, the channel structure comprises a vertical fin and a planar fin both composed of a semiconductor material; or the channel structure comprises a vertical fin composed of an insulating material and a planar fin composed of a semiconductor material.

Preferably, form a sacrificial layer over the horizontal surface of the substrate prior to forming the channel structure. Form a patterned window extending through the sacrificial layer down to the horizontal surface of the substrate for shaping the vertical fin of the channel structure. Deposit a semiconductor layer filling the patterned window to form the vertical fin of the channel structure and form a blanket semiconductor layer covering the sacrificial layer. Form a channel mask over the blanket semiconductor layer aligned with the vertical fin of the channel structure. Etch away portions of the blanket semiconductor layer aside from the channel mask to form the planar fin, whereby the channel structure comprises a vertical fin and a planar fin.

Preferably, the vertical fin and a planar fin are both composed of silicon; or the vertical fin and a planar fin are both composed of a material selected from Ge and SiGe.

Preferably, the semiconductor material comprises silicon (Si), and the sacrificial layer comprises silicon-germanium (SiGe). Preferably, the semiconductor material comprises a material selected from Ge and SiGe, and the sacrificial layer comprises a material selected from silicon (Si) and SiC.

Preferably, form a sacrificial layer over the horizontal surface of the substrate prior to forming the channel structure. Form a patterned window extending through the sacrificial layer down to the horizontal surface of the substrate for shaping the vertical fin of the channel structure. Deposit a dielectric layer filling the patterned window to form the vertical fin of the channel structure and form a blanket semiconductor layer covering the sacrificial layer. Form a channel mask over the blanket semiconductor layer aligned with the vertical fin of the channel structure. Etching away portions of the blanket semiconductor layer aside from the channel mask to form the planar fin, whereby the channel structure comprises a vertical dielectric fin and a planar semiconductor fin.

Preferably, the vertical fin is composed of a material selected from silicon dioxide and silicon nitride.

In accordance with another aspect of this invention, an FET device includes a semiconductor structure comprising a source region, a drain region over a horizontal surface of a substrate comprising an insulating material. A channel structure over the horizontal surface of the substrate connects between the drain region and the source region, with the channel structure comprising a horizontally extending, semiconductor, planar channel fin formed above a vertical fin with the planar and vertical fins having a T-shaped cross-section. The vertical fin has a proximal edge and a distal edge, with the proximal edge in contact with the horizontal surface of the substrate and with the planar fin contact with the distal edge of the vertical fin. A gate dielectric layer overlies exposed surfaces of the channel structure. A gate electrode straddles the channel gate dielectric and the channel structure.

Preferably, the channel structure comprises a vertical fin and a planar fin both composed of a semiconductor material. Preferably, the channel structure comprises a vertical fin composed of an insulating material and a planar fin composed of a semiconductor material. Preferably, the vertical fin and a planar fin are both composed of silicon; or the vertical fin and a planar fin are both composed of a material selected from Ge and SiGe.

Preferably, the vertical fin is composed of a dielectric and the planar fin is composed of a material selected from silicon (Si), germanium (Ge) and SiGe; or the vertical fin is composed of a dielectric and the planar fin is composed of silicon (Si) and the sacrificial layer is composed of SiGe.

The invention and objects and features thereof will be more readily apparent from the following detailed description and appended claims when taken with the drawings.

BRIEF DESCRIPTION OF THE DRAWINGS

The foregoing and other aspects and advantages of this invention are explained and described below with reference to the accompanying drawings, in which:

In FIG. 1A, a single fin with a height H is shown between the source and drain islands of a FinFET device with a double gate structure, i.e. the gate electrode straddling the fin. The double gate structure yields an overall edge contact between the fin and the gate electrode with a width of 2H.

FIG. 1B is a modification of the device of FIG. 1A with parallel fins included in a double gate structure yielding an overall edge contact between the fin and the gate electrode with a width of 4H.

FIG. 1C is a modification of the device of FIG. 1A in which the height of the single fin has been reduced to ⅔H, thereby yielding an overall edge contact between the fin and the gate electrode with a width of (4/3)H.

FIG. 1D is a modification of the device of FIG. 1A in which the height of the single fin has been reduced to ½H, yielding an overall edge contact between the fin and the gate electrode with a width of 1H.

FIGS. 4F'–4G' are perspective views illustrating alternative final manufacturing steps to those in FIGS. 4A–4G.

FIGS. 5A'–5B' show an alternative to the configuration shown in FIGS. 5A–5B with the planar fins reaching to the sidewalls of the source/drain islands and the vertical fins recessed by the thickness of the planar fins.

FIGS. 9A'–9B' show an alternative to the configuration shown in FIGS. 9A–9B with the planar fins reaching to the sidewalls of the source/drain islands and the vertical fins recessed by the thickness of the planar fins.

DETAILED DESCRIPTION OF PREFERRED EMBODIMENTS

Device Width Quantization Problem for FinFET Devices

FIGS. 1A–1D are perspective views of conventional, FinFET transistors 10 with vertically oriented channel fins 14A–14D which illustrate a problem encountered when designing an FinFET device with vertically oriented channel fins having a desired width W. FIGS. 1A–1D show four cases including various vertical fin heights of H, $\frac{2}{3}$H and $\frac{1}{2}$H. There is a problem that the width of the FinFET device is dependent upon the height of the fin, but it is desirable to have greater flexibility in order to achieve a wide array of width dimensions to match design criteria for the MOSFET devices being manufactured, independently of the thickness of the fins, which is not very flexible because of manufacturing constraints.

In FIGS. 1A–1D, the device width quantization problem for FinFET devices is illustrated with examples of various widths, e.g.

Figure 1A:
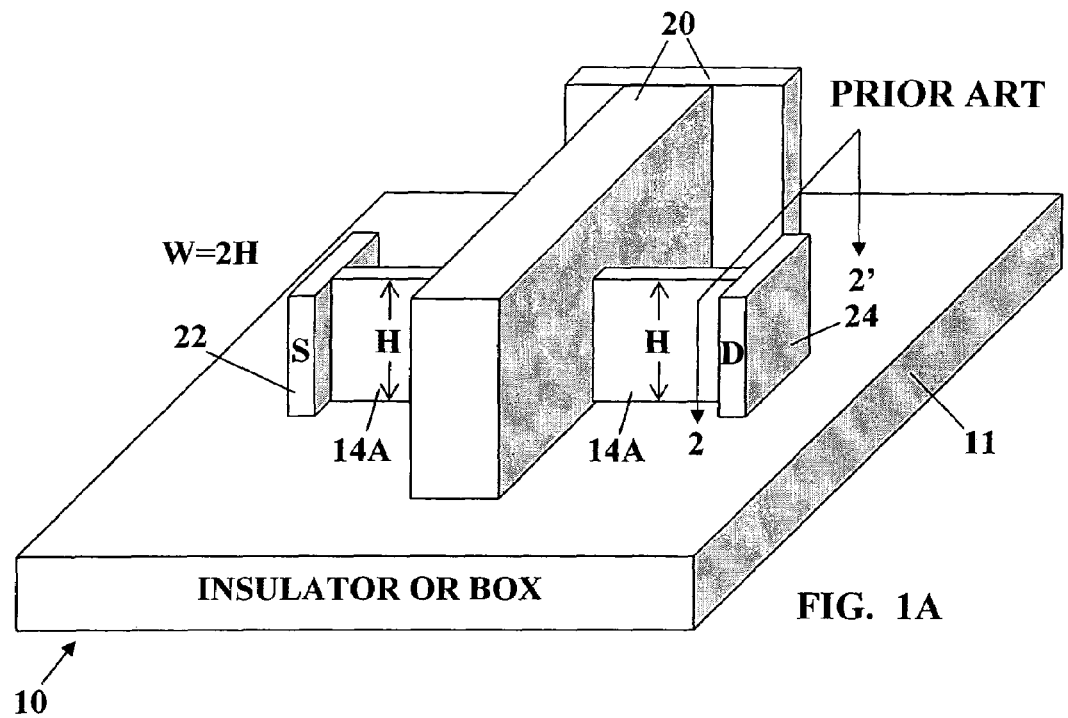
FIGS. 1A–1D are perspective views of prior art types of vertical channel, FinFET devices which show the various fin structures to illustrate variations of single fins, parallel fins and fins with various heights.
Figure 1B:
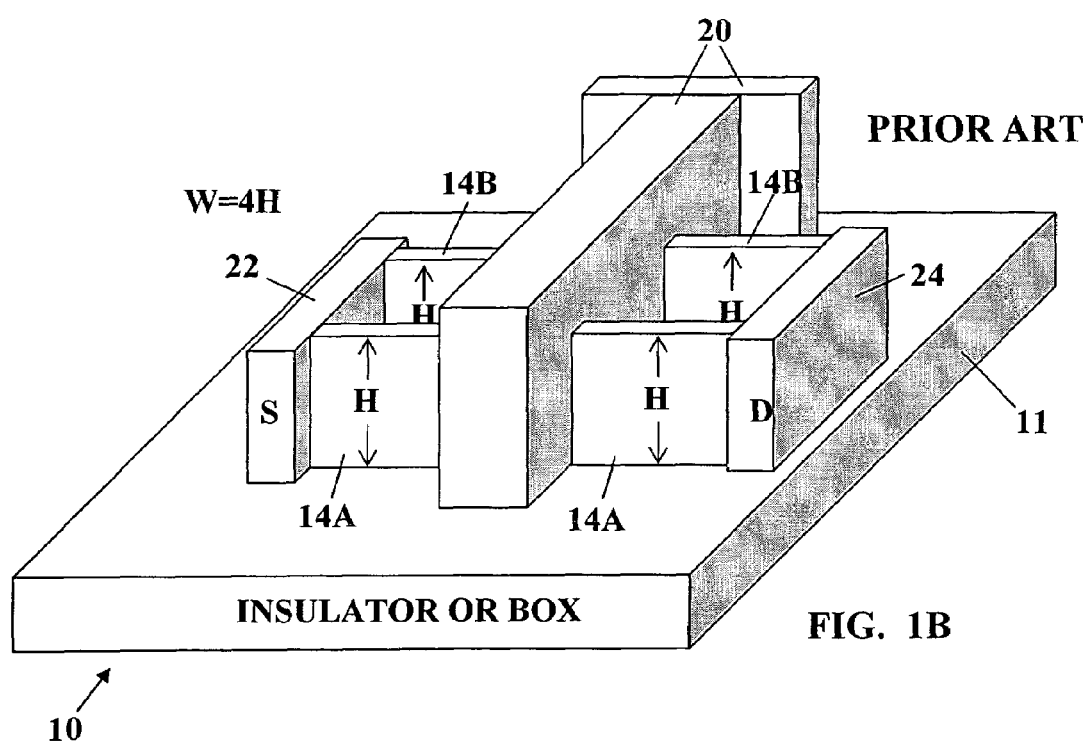
Figure 1C:
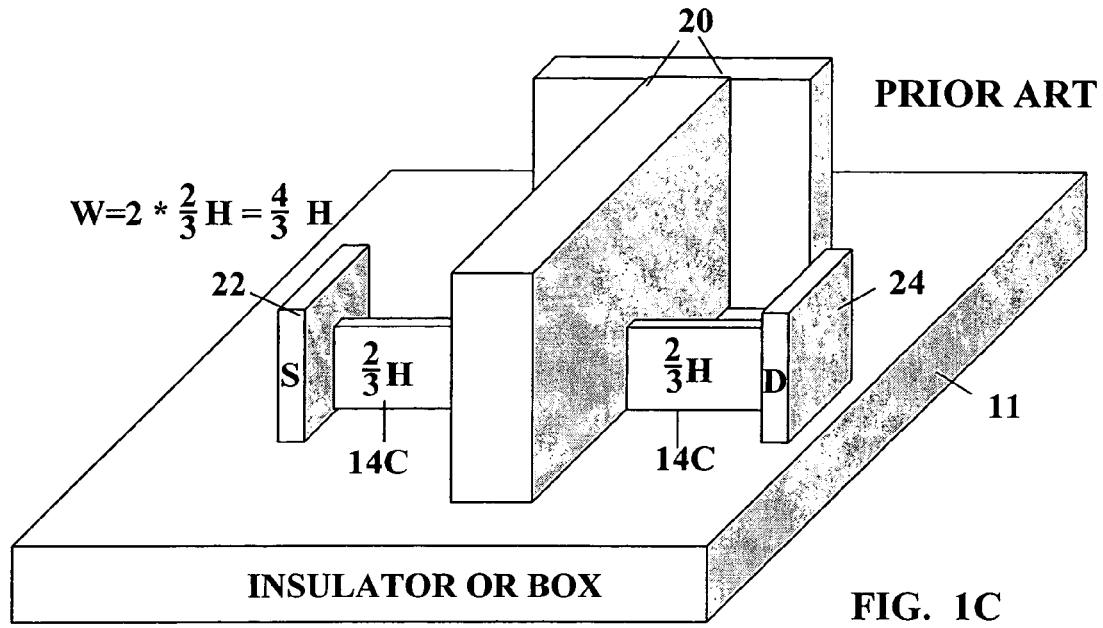
Figure 1D:
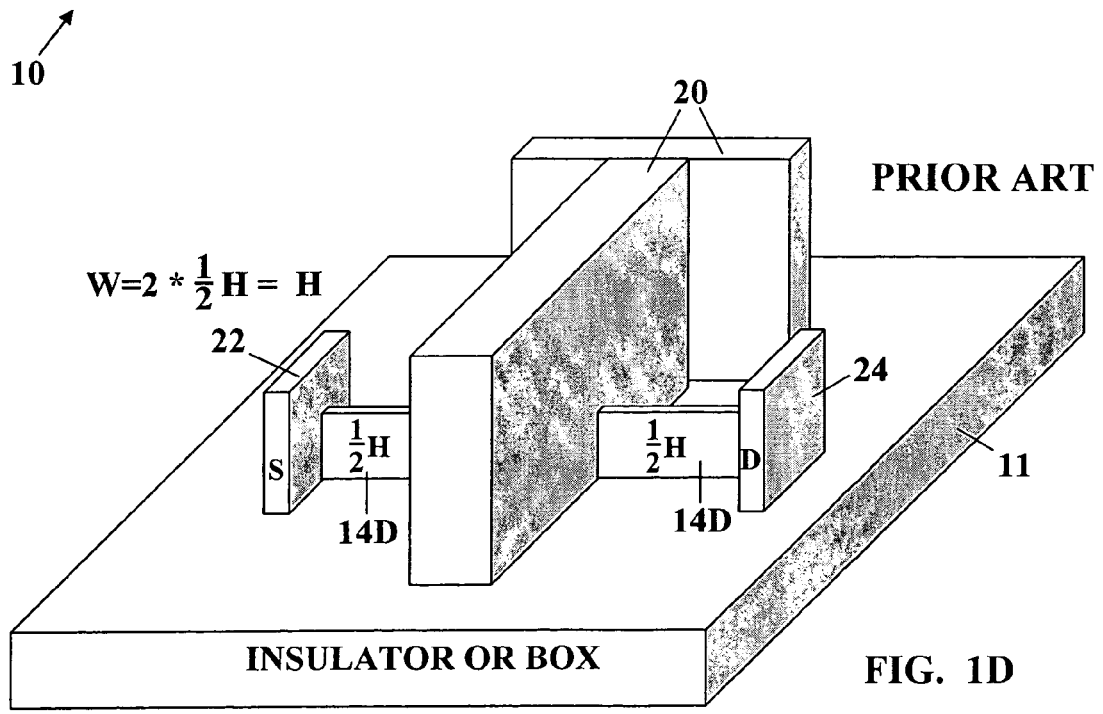

W=2H in FIG. 1A,
W=4H in FIG. 1B,
W=2*$\frac{2}{3}$H=$\frac{4}{3}$H in FIG. 1C, and
W=2*$\frac{1}{2}$H=H in FIG. 1D.

Each of these widths is tied to a fixed thickness of the fins 14A–14D. There should be a thick hard mask in between the gate and the fin on top of the fin for the above equations to be true.

In FIG. 1A, a prior art type of FinFET device 10 is fabricated on a substrate 11 composed of a dielectric material such as an insulator or a Buried OXide (BOX). The FinFET device 10 includes a doped silicon source island 22 and a doped silicon drain island 24 connected by a very thin, doped silicon fin 14A with a vertically oriented cross-section. The vertical fin 14A comprises the channel and extension of FinFET device 10. While fin 14A includes the extension of the FinFET, the portion thereof under the gate is the channel of the FinFET. The thin silicon fin 14A is connected at its opposite ends to the source island 22 and the drain island 24. A double gate electrode 20, composed of doped polysilicon, straddles the silicon fin 14A and is isolated therefrom by a thin layer of gate oxide (not shown). In other words, the vertical cross-section fin 14A extends horizontally across the substrate 11 with the gate electrode 20 straddling the fin 14A juxtaposed with planes on either side thereof. The structure has the advantage of providing double gates to effectively suppress SCE and enhance drive current.

In FIG. 1A, a single fin with a height H is shown between the source and drain islands of a FinFET device 10 with a double gate structure, i.e. the gate electrode 20 straddles the fin 14A. In the double gate structure of FIG. 1A the overall edge contact between the fin 14A and the gate electrode 20 comprises the dimension 2H. FIG. 1B is a modification of the prior art FinFET device 10 of FIG. 1A, which shows a modification of the double gate structure of FIG. 1A wherein two parallel fins 14A/14B are formed between the doped silicon source island 22 and a doped silicon drain island 24. In FIG. 1B the two parallel fins 14A/14B yield an overall edge contact width W between the fins 14A/14B and the gate electrode 20 of W=4H.

FIG. 1C is a modification of the prior art FinFET device 10 of FIG. 1A in which the height of the single fin 14C is only ($\frac{2}{3}$)H yielding an overall edge contact width W between the fin 14C and the gate electrode 20 of W=($\frac{4}{3}$)H.

FIG. 1D is a modification of the prior art FinFET device 10 of FIG. 1A in which the height of the single fin 14D is only $\frac{1}{2}$H, yielding an overall edge contact width W of the fin 14D with the gate electrode 20 of W=(1)H.

Figure 6A:
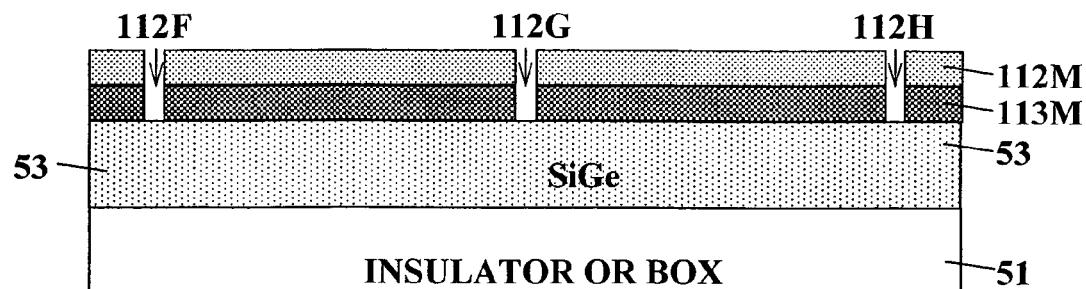
FIGS. 6A–6I are sectional views which illustrate a preferred method of manufacture of the homogeneous, T-Fin FET device shown in FIG. 5B.

While FinFET devices are adapted to provide the benefit of double-gated devices, such as improved roll-off, the problem is that device widths are quantized as described above with reference to FIGS. 1A–1D. The standard device width is twice the fin height as seen in the fin 14A of FIG. 1A. With multiple fins one can only get device widths of 2nH where "n" is a positive integer, as shown in FIG. 1B or 4H, 6H, etc. for a given height H of the fins 14A–14D employed. Reducing the heights provides a limited range of contact widths as exemplified by FIGS. 1C and 1D which illustrate the result of facilitating other device widths that circuit designers need, by building fins with different heights. Even then (by virtue of being limited to the process window availability), the typical approach is also quantified with options such as $\frac{3}{4}$, $\frac{2}{3}$ or $\frac{1}{2}$, $\frac{1}{3}$, or $\frac{1}{4}$ heights. Combining many different heights is extremely difficult and needs major control of multiple fin heights with multi-thickness processes.

Figure 2:
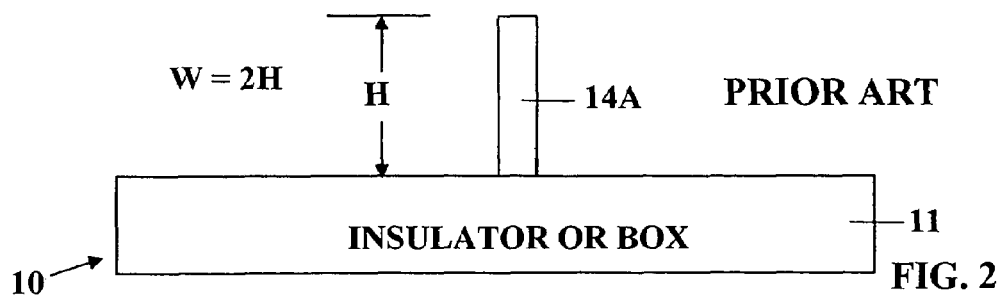
FIG. 2 is a perspective view taken along line 2A–2A' in FIG. 1A, showing a prior art double gate vertical Fin channel FET device with a vertical fin with a height H.

FIG. 2 shows a cross-section, taken along line 2–2' in FIG. 1A, of a prior art FinFET channel fin 14A for a conventional, vertically oriented FinFET fin 14A. The conventional, vertically oriented FinFET fin 14A has a height of H, so that for the double gate FET device of FIG. 1A the channel has a width W=2H.

T-Fin FET Design that Allows Variable W Because of Lithographically Varying D

Figure 3:
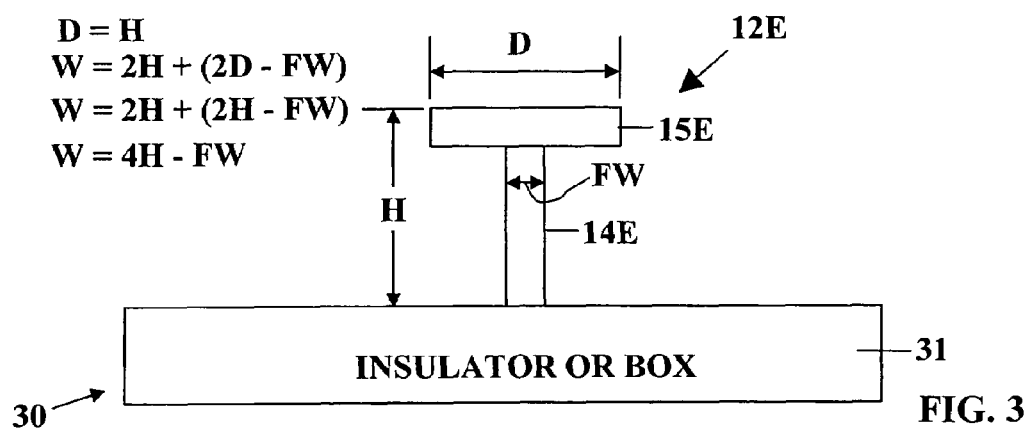
FIG. 3 shows a cross-sectional view of a portion of an exemplary homogeneous T-channel Fin FET device in accordance with a first embodiment of this invention. The view is taken along line 3–3' in FIGS. 4F and 4G (as well as FIGS. 4F' and 4G').
Figure 4A:
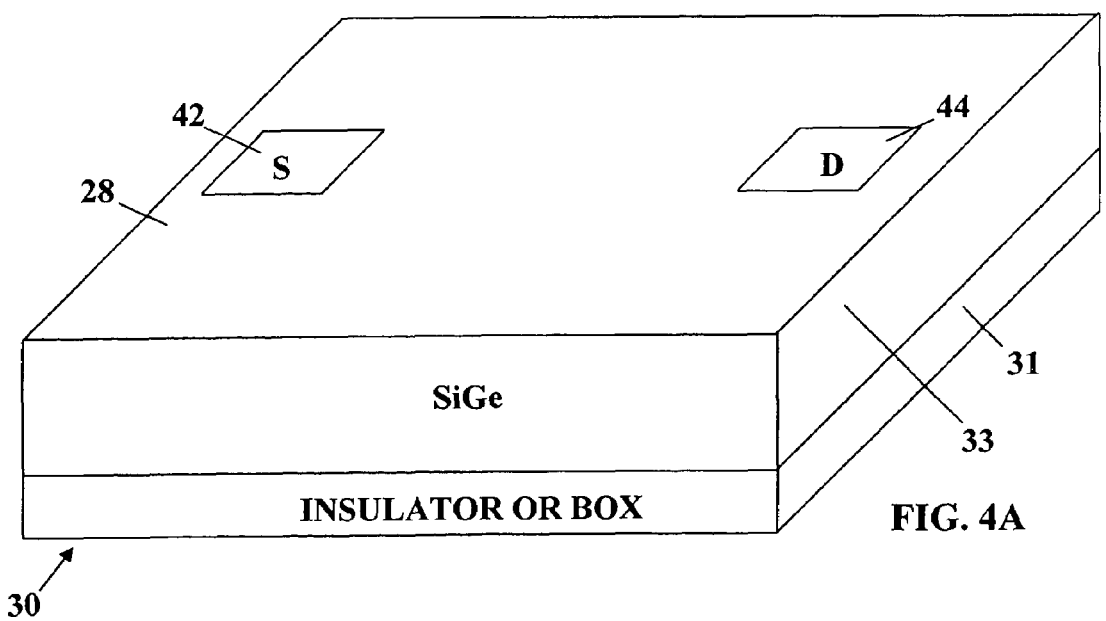
FIGS. 4A–4G and are perspective views illustrating major steps in the process of forming a double gate channel homogeneous T-Fin FET device in accordance with a first embodiment of this invention, which includes the compound T cross-section channel shown in FIG. 3 formed with the vertical silicon fin capped by the planar silicon fin between a source island and a drain island (both of which are monocrystalline) of the T-Fin FET device.
Figure 4B:
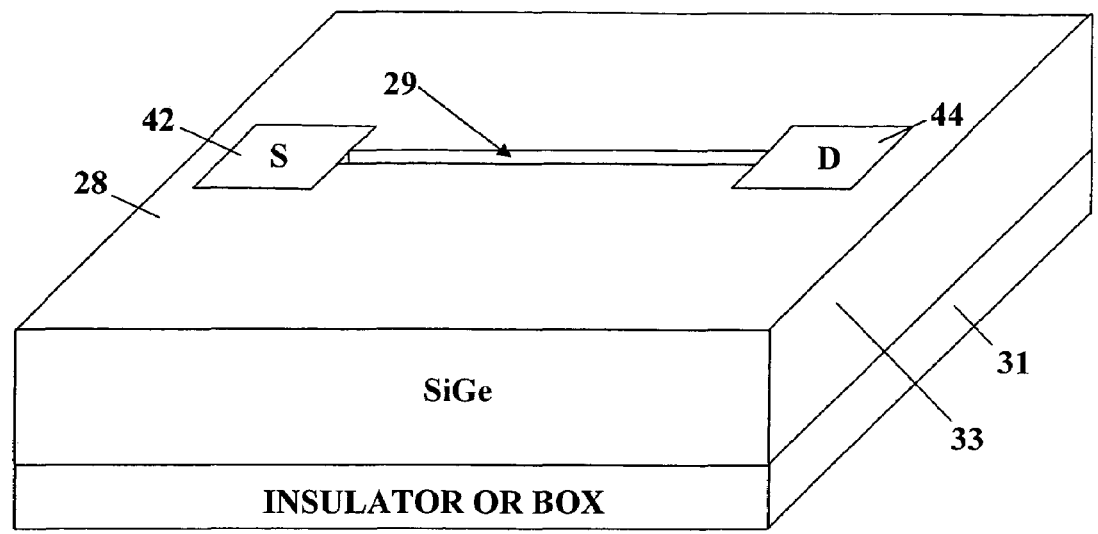
Figure 4C:
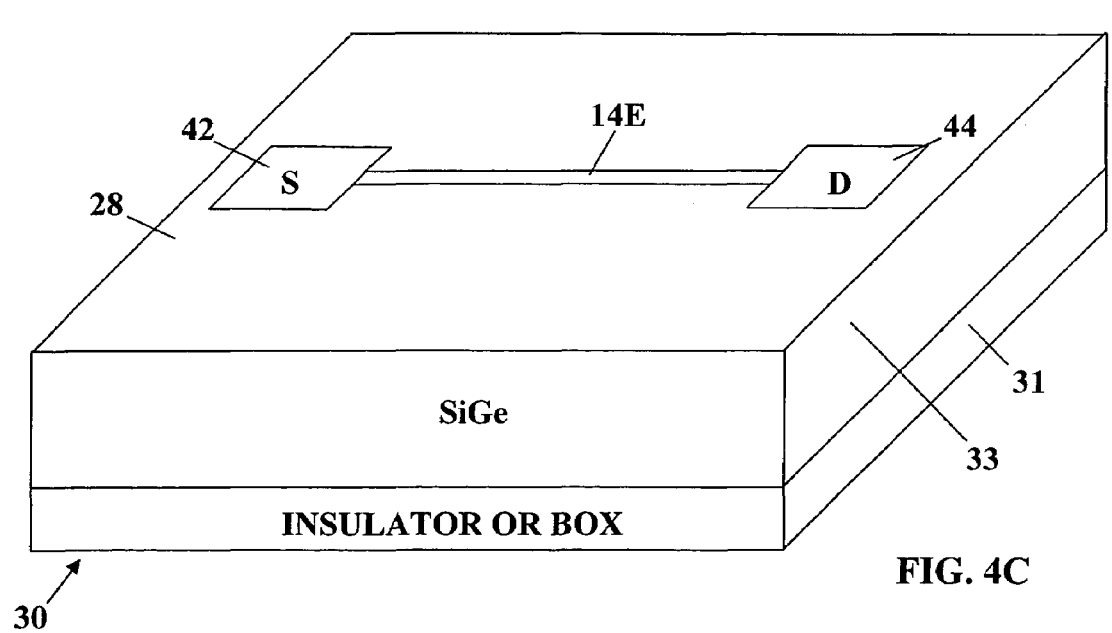
Figure 4D:
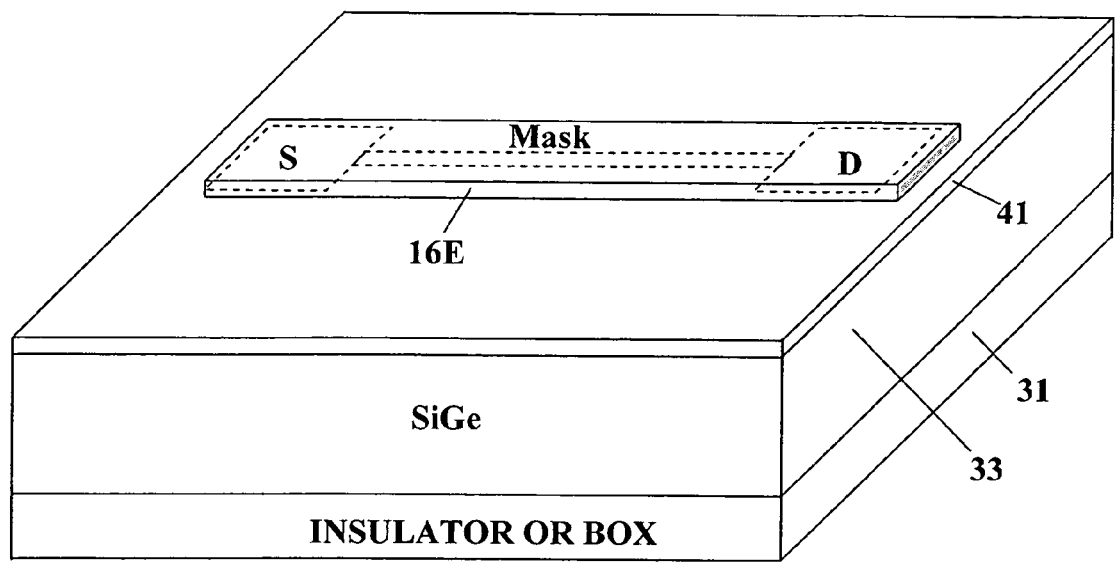
Figure 4E:
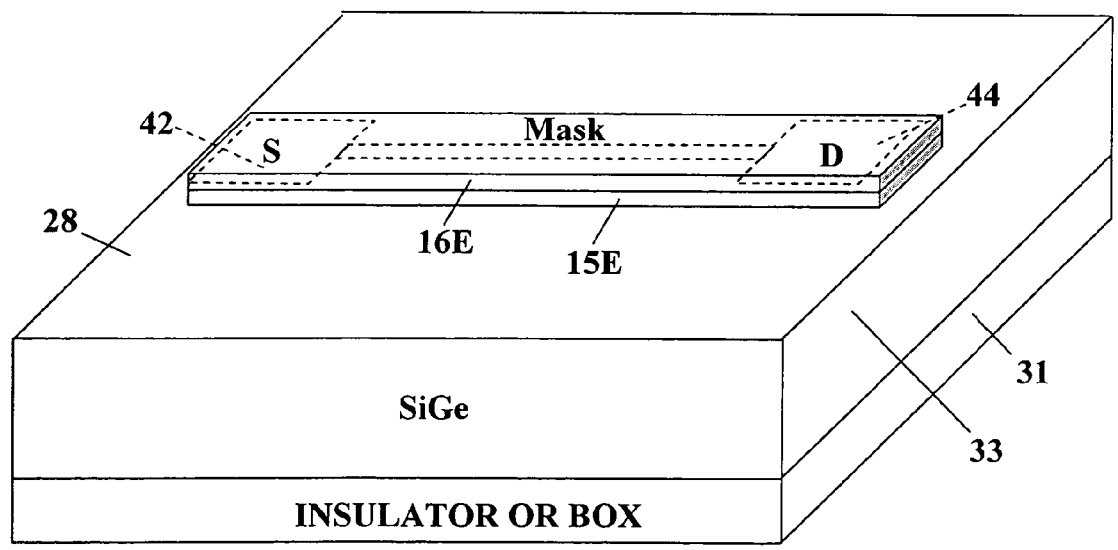
Figure 4F:
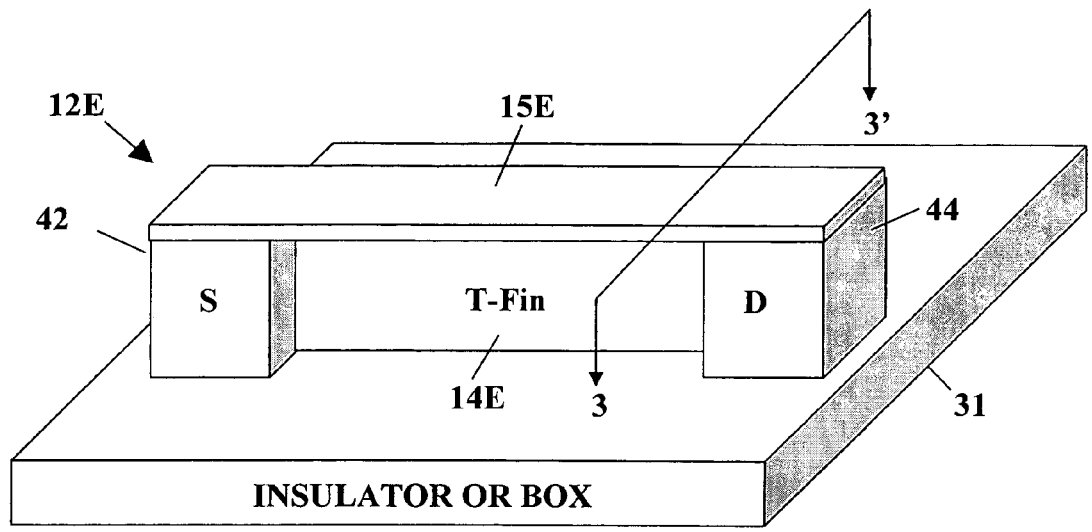
Figure 4G:
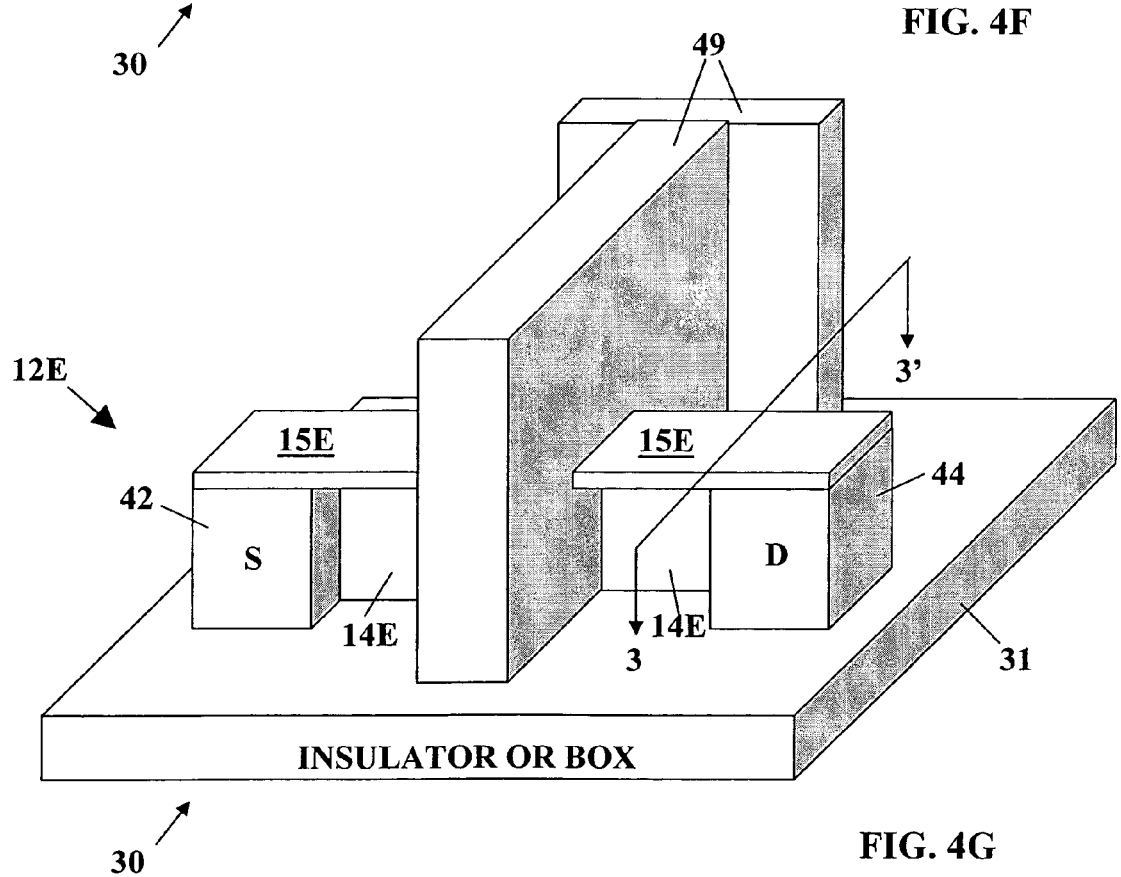
Figure 4F:
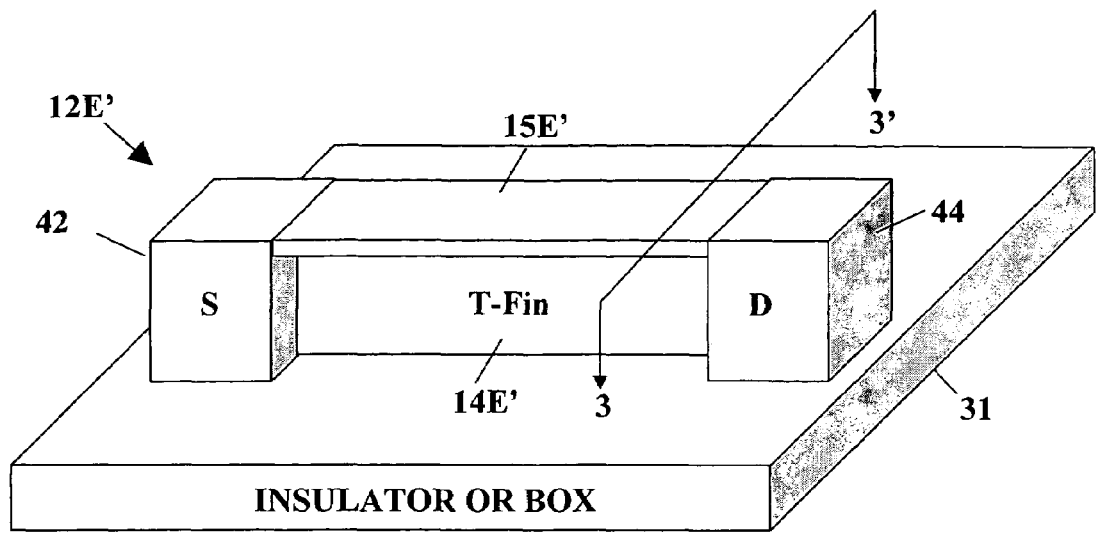
Figure 4G:
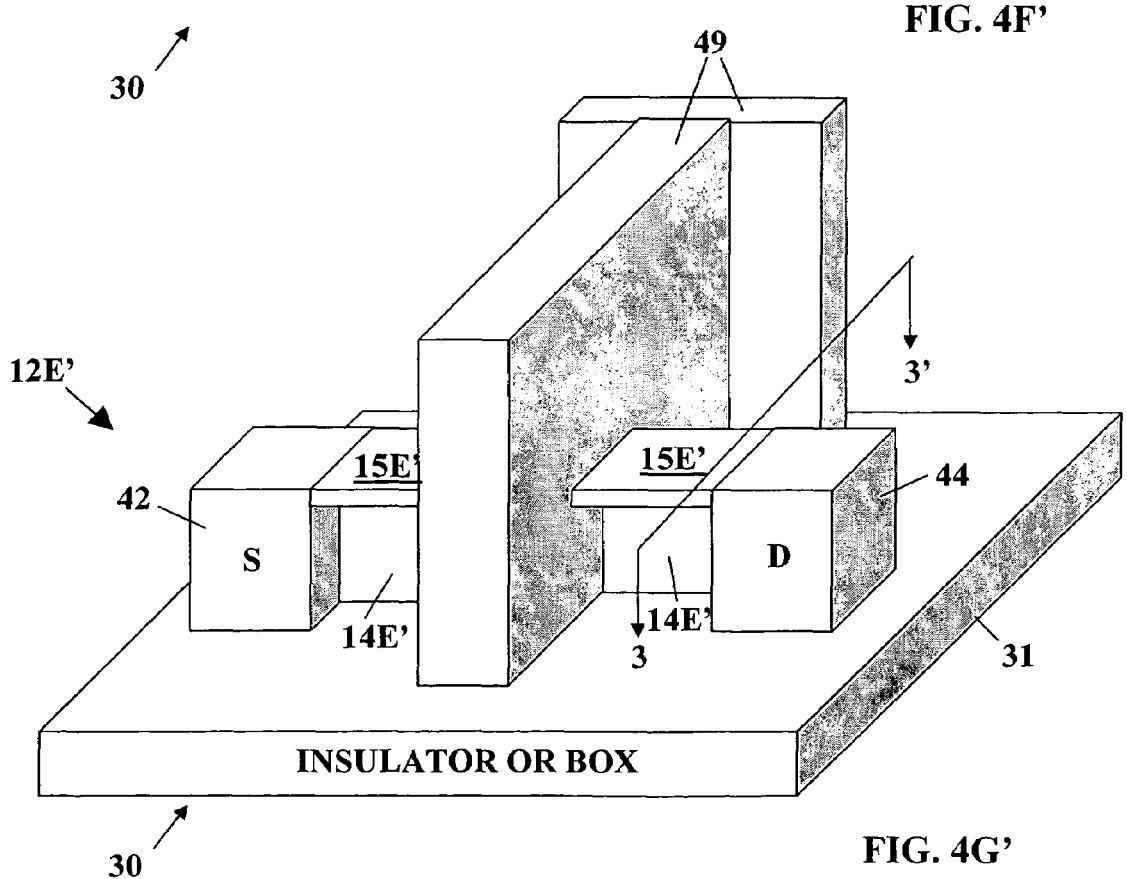

FIG. 3 shows a cross-sectional view taken along line 3–3' in FIGS. 4F and 4G (as well as FIGS. 4F' and 4G') of a portion of a T-Fin FET device 30 in accordance with this invention. The T-Fin FET device 30 includes a substrate 31 composed of a dielectric material comprising an insulator layer or a Buried Oxide (BOX) layer. The substrate 31 has a horizontal top surface supporting a compound, T-shaped cross-section, fin (T-fin) channel 12E with a vertical fin 14E below and a planar fin 15E on top of vertical fine 14E. The design of the T-fin channel 12E is a modification of the FinFET design, because the T-fin channel 12E has a T-shaped cross-section.

The T-Fin channel 12E includes a vertically-oriented (vertical) fin 14E and a horizontally-oriented (planar) fin 15E, with the planar fin 15E on top of the upper end of the vertical fin 14E. The planar fin 15E on top is in direct mechanical and electrical contact with the vertical fin 14E, and is preferably integral therewith.

The vertical fin 14E plus the planar fin 15E have a total height of H, and a depth D, so that for the double gate FET device of FIG. 3 the channel has a width W=2H+(2D−FW). For this example, as D=H, the width W=2H+(2H−FW)=4H−FW. Of course the width W can be increased or can be decreased by modification of the depth D of the planar fin 15E without modification of the height H, which is an advantage in processing for specific values of W.

The core of the invention is the structure of the T-Fin channel 12E of T-Fin FET 30 shown in FIG. 3 which is adapted to formation of a double gate with increased width W. Some advantages of the first embodiment of the T-Fin FET are illustrated by FIGS. 3, 4A–4G, 4F'–4G', 5A–5B and FIGS. 6A–6I. The advantages of the first embodiment of the invention are as follows:

(i) If the depth D of the T-Fin 12E equals the height H, i.e. D=H, as in FIG. 3, the T-FinFET structure of FIG. 3 can give almost twice the width as that of the vertical FinFET double gate structure of FIGS. 1A/2 in the same space on a chip. This significantly reduces the area of the chip for a given chip performance.

(ii) The major problem of device width quantification is overcome since the width W of the planar portion 15E of the T-Fin channel 12E can be varied to any dimension required.

(iii) A large width W is obtainable with a minimum pitch.

It is critical to avoid/eliminate the limitations (effects) caused by the device width quantification.

FIGS. 4A–4G and 4F'–4G' are perspective views illustrating major steps in the process of forming a double gate channel T-Fin FET device 30 in accordance with a first embodiment of this invention, which includes the compound T cross-section channel 12E shown in FIG. 3 formed with the vertical silicon fin 14E capped by the planar silicon fin 15E between a source island 42 and a drain island 44 (both of which are monocrystalline) of the T-Fin FET device 30.

FIG. 4A shows a T-Fin FET device 30 incorporating the T-Fin 12E of FIG. 3 in an early stage of fabrication. A pair of source drain islands 42/44 are surrounded by a planar SiGe alloy layer 33 that has been formed on the surface of the substrate 31 which is composed of a dielectric material, i.e. an insulating or BOX layer. The device 30 is formed on the horizontally oriented surface of a substrate 31 comprising an insulator or a Buried OXide (BOX) layer. The monocrystalline source/drain islands 42/44 of the T-Fin FET device 30 have been formed upon the horizontal surface of the substrate 31.

A preferred method for forming the monocrystalline source island 42 and a drain island is the process as follows:

The starting substrate is a Silicon-On-Insulator layer SOI layer (not shown) with the substrate 31.

1. An original SiGe epitaxial layer (not shown) is grown on the top surface of the SOI layer.
2. A hard mask layer and a resist mask are formed on top of SiGe and the resist mask is patterned, i.e. exposed and developed with the patterned area being removed.
3. Then the SiGe is etched off from those areas where there is no resist mask on top. Those areas remain as Si source/drain islands 42/44 after the whole process is over.
4. Next, the hard mask is completely removed.
5. Then, with an annealing step, Ge is diffused into the original SOI layer from those areas where there is only SiGe on top to form a sacrificial silicon-germanium (SiGe) layer 33.
6. Then a CMP planarization step is done to level the sacrificial SiGe layer 33 with the Si islands 42/44. Another layer of silicon epi can be grown after step 4 to protect the SiGe layer from the annealing atmosphere. The resulting sacrificial SiGe layer 33 comprises a blanket monocrystalline sacrificial SiGe layer on the substrate 31 surrounding the source/drain islands 42/44.

The details of the process to obtain a blanket relaxed SiGe on a BOX layer is described in Tezuka et al. "High Performance Strained Si-on-Insulator MOSFETs by Novel Fabrication Process Utilizing Ge-Condensation Technique" 2002 Symposium On VLSI Technology Digest of Technical papers 96–97 (2002 IEEE).

FIG. 4B shows the T-Fin FET device 30 of FIG. 4A after a window 29 has been etched through the sacrificial SiGe layer 33 to the surface of the substrate 31 between the source/drain islands 42/44. After the sacrificial SiGe layer 33 was formed, a first silicon nitride mask (not shown but similar to mask 113M in FIG. 6A) was deposited and a photoresist layer (not shown but similar to mask 112M in FIG. 6A) was applied above the top surface 28 and was patterned preferably using optical lithography, electron beam lithography, x-ray lithography, or other conventional means to pattern that first silicon nitride mask by forming windows 112F/112G/112H therethrough.

Figure 6B:
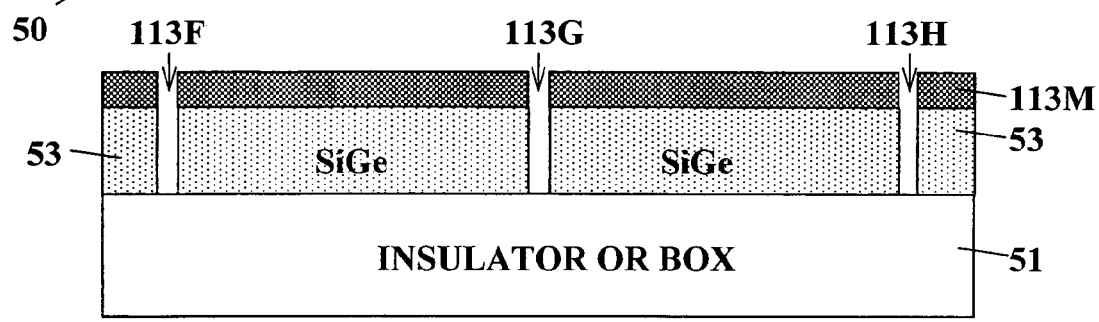

Then, etching through windows 112F/112G/112H through that first silicon nitride mask was employed to define a pattern in the SiGe layer 33 in the form of a vertical fin window 29 (like windows 113F/113G/113H in FIG. 6B). The vertical fin window 29 reaches down through the sacrificial SiGe layer 33 to expose a portion of the horizontal surface of the substrate 31 between the source/drain islands 42/44. The vertical fin window 29 is provided to shape the vertical fin 14E which is the vertical portion of the compound fin 14E/15E seen in FIG. 3.

The vertical fin window 29 is preferably formed by RIE to remove the unprotected portion of the sacrificial SiGe layer 33. Then the first silicon nitride mask was stripped from the T-Fin FET device 30. In the current state of the art, the vertical fin window 29 preferably has a width from about 10 nm to about 20 nm. The sacrificial SiGe layer 33, which preferably has a composition from about 5 atomic % to about 30 atomic % germanium (Ge), preferably has a thickness from about 5 nm to about 100 nm.

FIG. 4C shows the T-Fin FET device 30 of FIG. 4B after the vertical fin window 29 has been filled with strained monocrystalline silicon 14E which is grown epitaxially in contact with the exposed horizontal surface of the substrate 31 at the bottom of the vertical fin window 29 and on the SiGe sidewalls of the vertical fin window 29. The SiGe layer 33 provides a compatible crystal lattice structure which nucleates growth of the monocrystalline vertical fin 14E that is strained by the mismatch in crystal lattices caused by the presence of the Ge in the sacrificial SiGe layer 33.

At this point, the T-Fin FET device 30 has been partially fabricated by epitaxial deposition of monocrystalline silicon which has filled the window 29 with the thin, vertical silicon fin 14E of FIG. 3 providing a connection between the silicon source/drain islands 42/44. The thin, vertical, silicon fin 14E comprises the lower, vertical portion of the T-Fin channel of the FET device 30 of this invention. The silicon source island 42, the silicon drain island 44, and the vertical fin 14E are all monocrystalline.

In FIG. 4D, the T-Fin FET device 30 of FIG. 4C is shown after the epitaxial deposition of monocrystalline silicon continues above the surface 28 of the sacrificial SiGe layer 33, beyond filling the window 29 to form a blanket layer 41 of strained monocrystalline silicon over the exposed surface of the sacrificial SiGe layer 33 and after formation of a horizontal-fin shaping mask 16E preferably composed of silicon nitride over the blanket layer 41 of monocrystalline silicon.

In FIG. 4E, the T-Fin FET device 30 of FIG. 4D is shown after the exposed portions of the blanket layer 41 of monocrystalline silicon have been etched back to form the planar fin 15E, completing the formation of the compound T-fin channel 12E for the silicon channel of the T-Fin FET device 30, with the horizontal-fin shaping mask 16E remaining in place above the planar fin 15E. After this step, before removing the mask, SiGe is also horizontally etched away with an RIE process. Then, the mask is removed, and the remaining SiGe is etched away with an etch that is selective to Si.

In FIG. 4F, the T-Fin FET device 30 of FIG. 4E is shown after the horizontal-fin shaping mask 16E has been stripped away followed by etching away the sacrificial SiGe layer 33, revealing the sides of the source/drain islands 42/44 and the completed T-fin channel 12E (formed by vertical fin 14E and planar fin 15E) supported on the horizontal surface of the substrate 31. Note that the planar fin 15E covers the top surfaces of the source/drain islands 42/44, and is therefore longer than the vertical fin 14E.

In FIG. 4G, the T-Fin FET device 30 of FIG. 4F is shown after a thin gate oxide layer (not shown for convenience of illustration) has been formed over the T-fin channel 12E and the source/drain islands 42/44. After the thin gate oxide layer gate was deposited over device 30, the gate electrode 49 was formed straddling the compound T-fin (channel) 14E/15E over the exposed surface of the substrate 31 to form a double gated MOSFET, as will be well understood by those skilled in the art of FinFET devices. That is to say that the gate 49 is juxtaposed with both sides of the vertical fin 14E as well as the top and bottom of the planar fin 15E.

Thus, the gate electrode 49, which is preferably composed of doped polysilicon, extends across the silicon fin 14E/15E and, in the conventional manner, is isolated therefrom by the thin layer of gate oxide. The vertical cross-section fin 14E/15E extends horizontally across the substrate 31 with the double gate electrode 49 straddling the fin 14E/15E in planes, on either side thereof. Thus, inversion layers are formed on both sides of the fin 14E/15E. The structure has the advantage of providing double gates to effectively suppress SCE and enhance drive current. Since the channels are parallel planes, there is no problem with corner effects.

At this point, the T-fin 12E is doped by angled ion implantation as will be well understood by those skilled in the art. The ion implantation is done to form the extensions and halos. Since the substrate 31 is composed of a dielectric material, the doping will not cause a short circuit between the source/drain islands 42/44 and/or the vertical fin 14E of the channel 14E/15E.

FIGS. 4F'–4G' show an alternative to the configuration shown in FIGS. 4F–4G with the planar fin 15E' reaching to the sidewalls of the source/drain islands 42/44 and the vertical fin 14E' recessed by the thickness of the planar fin 15E'.

Figure 5A:
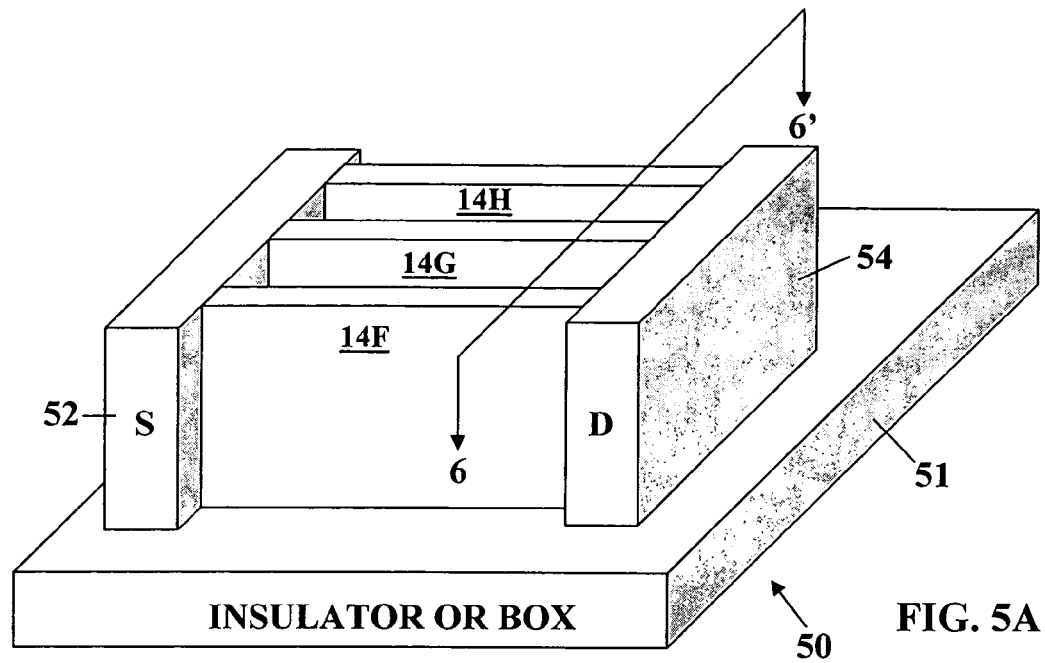
FIG. 5A shows a cut-away perspective view of a portion of a homogeneous T-Fin FET device with three vertical fins arranged in parallel between the source/drain islands on the substrate with the gate electrode and the three corresponding planar fins of the T-fins of FIG. 5B removed for purposes of showing the arrangement of the three vertical fins.

FIG. 5A shows a cut-away perspective view of a portion of a T-Fin FET device 50 with three vertical fins 14F, 14G, and 14H arranged in parallel between the source/drain islands 52/54 on the BOX substrate 51 with the gate electrode 59 and the three corresponding planar fins 15F/15G/15H of the T-fins 12F/12G/12H removed for purposes of showing the arrangement of the three vertical fins 14F/14G/14H.

Figure 5B:
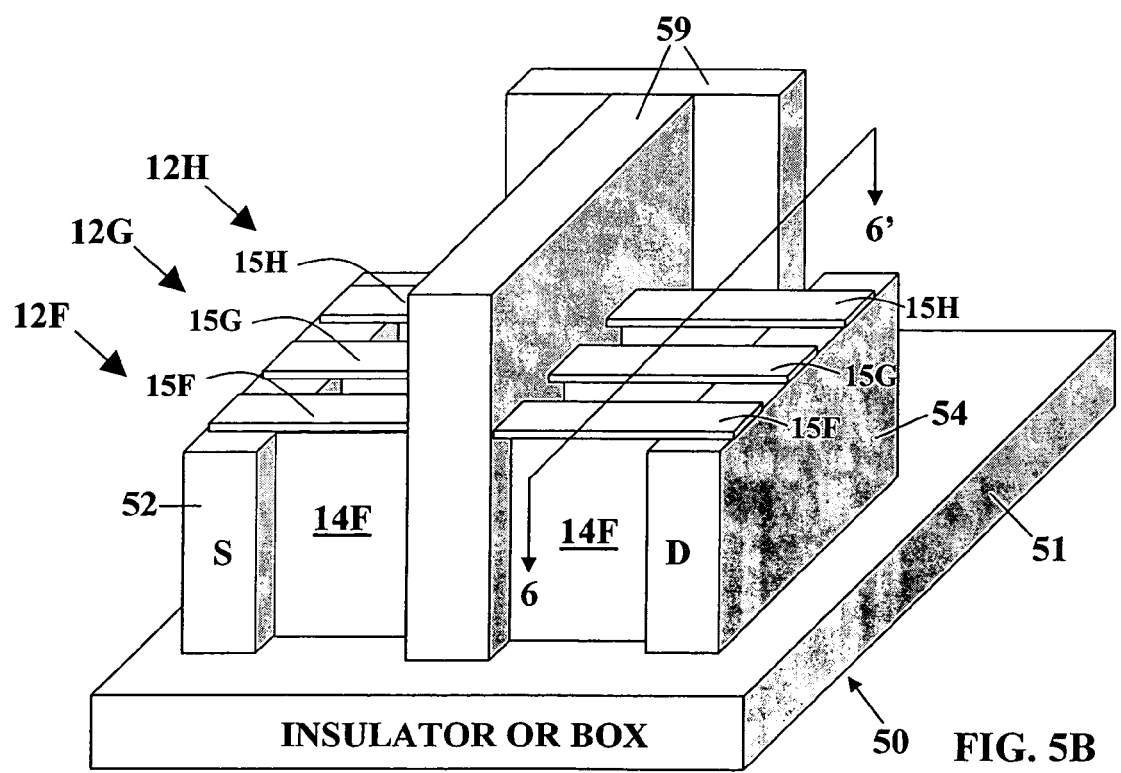
FIG. 5B shows a perspective view of the homogeneous T-Fin FET device of FIG. 5A with the completed set of three homogeneous T-fins arranged in parallel and with the gate electrode in place straddling the three sets of T-fins.
Figure 5A:
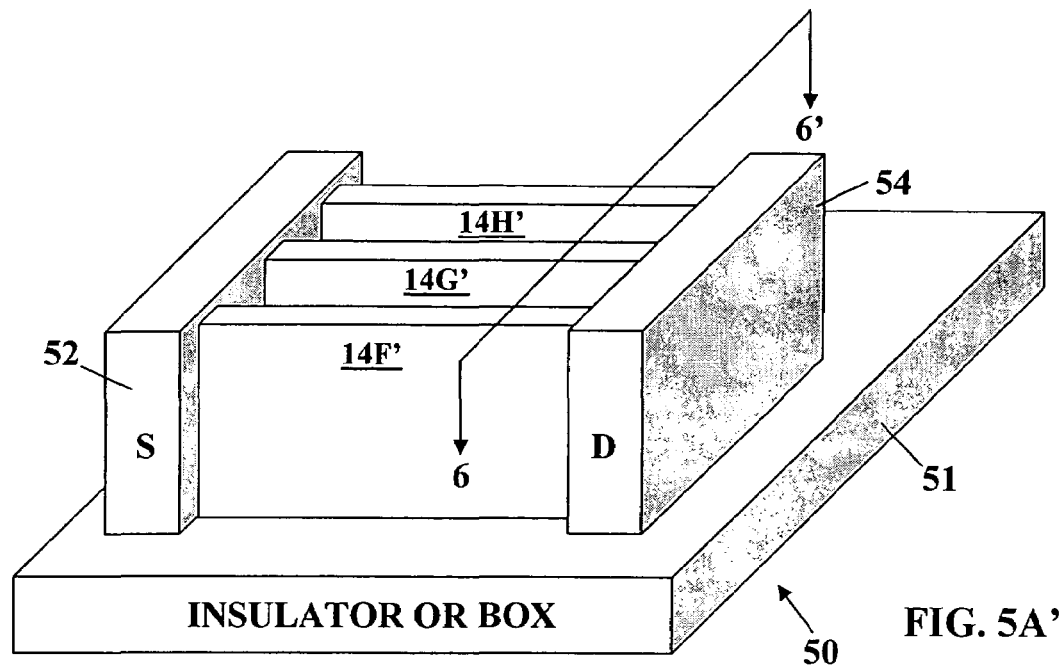
Figure 5B:
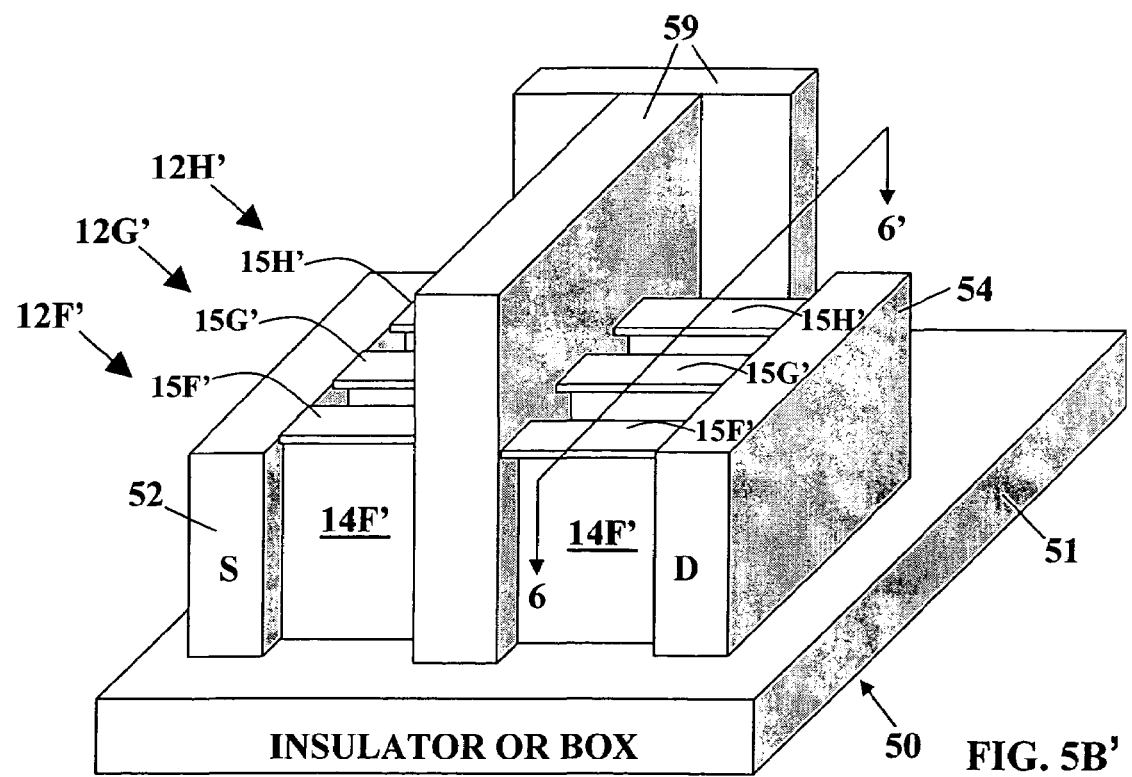

FIG. 5B shows a perspective view of the T-Fin FET device 50 of FIG. 5A with the completed set of three T-fins 12F/12G/12H arranged in parallel and with the gate electrode 59 in place straddling the three sets of T-fins.

FIGS. 5A'–5B' show an alternative to the configuration shown in FIGS. 5A–5B with the planar fins 15F'/15G'/15H' reaching to the sidewalls of the source/drain islands 52/54 and the vertical fins 14F'/14G'/14H' recessed by the thickness of the planar fins 15F'/15G'/15H'.

FIGS. 6A–6I are sectional views which illustrate a preferred method of manufacture of the T-Fin FET device 50 shown in FIG. 5B.

FIG. 6A shows a sectional view taken along line 6–6' in FIG. 5B of the T-Fin FET device 50, which is fabricated on a substrate 51, which is preferably composed of an insulator or Buried Oxide (BOX) layer. A blanket, conformal, sacrificial layer 53 of a SiGe alloy has been formed over the top, planar, horizontal surface of substrate 51 by a process as described above. The sacrificial SiGe layer 53 preferably has a composition from about 5 atomic % to about 30 atomic % germanium (Ge); and it preferably has a thickness from about 5 nm to about 100 nm.

A blanket, conformal, first mask 113M preferably comprising a layer of silicon nitride has been formed over the blanket sacrificial SiGe layer 33. A photoresist mask 112M patterned with vertical-fin/channel window patterns 112F, 112G and 112H extending therethrough has been formed on the top surface of the first mask 113M and the vertical-fin/channel window patterns 113F, 113G and 113H with typical widths of 10–20 nm have been etched through the first mask 113M to expose the top surface of the sacrificial layer 53 therebelow.

FIG. 6B shows the device 50 of FIG. 6A after the photoresist mask 112M was stripped and the patterned openings comprising the vertical fin channel window patterns 112F, 112G and 112H (previously etched through the first mask 113M) were used to etch vertical-fin/channel windows 113F, 113G and 113H through the sacrificial layer 53 down to the top, planar, horizontal surface of the substrate 51.

Figure 6C:
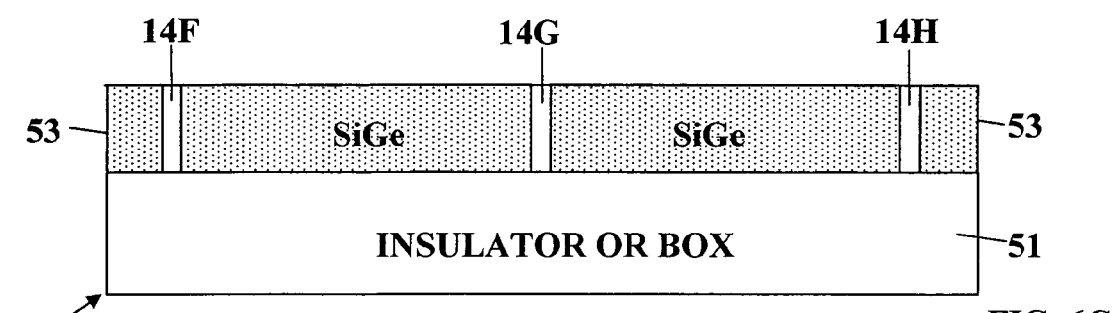

FIG. 6C shows the device 50 of FIG. 6B after a process of Chemical Vapor Deposition (CVD), e.g. Vapor Phase Epitaxy (VPE), was employed to form thin silicon fins on the exposed top, horizontal surface of the substrate 51 within the vertical-fin/channel windows 113F/113G/113H in the sacrificial layer 53 composed of SiGe, in much the same way as shown in FIG. 4B. The epitaxial deposition of silicon fills the vertical-fin/channel windows 113F/113G/113H between the source/drain islands 42/44 (which are not shown in this sectional view) to the top forming the vertical fins 14F/14G/14H, shown in FIG. 5A.

Figure 6D:
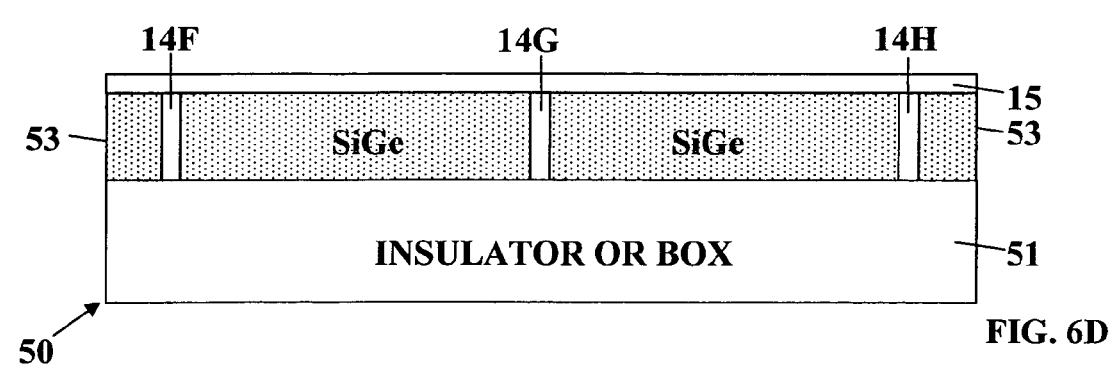

FIG. 6D shows the device 50 of FIG. 6C after continuing epitaxial deposition of silicon (Si) to form a blanket, thin layer of silicon 15 on the surface of the sacrificial layer 53 (as well as the source/drain islands 52/54 connected thereto, but not shown). As in the case of the vertical fins 14F/14G/14H, the silicon layer 15 is a strained monocrystalline silicon layer as the result of employing the epitaxial deposition process over the monocrystalline SiGe layer.

Figure 6E:
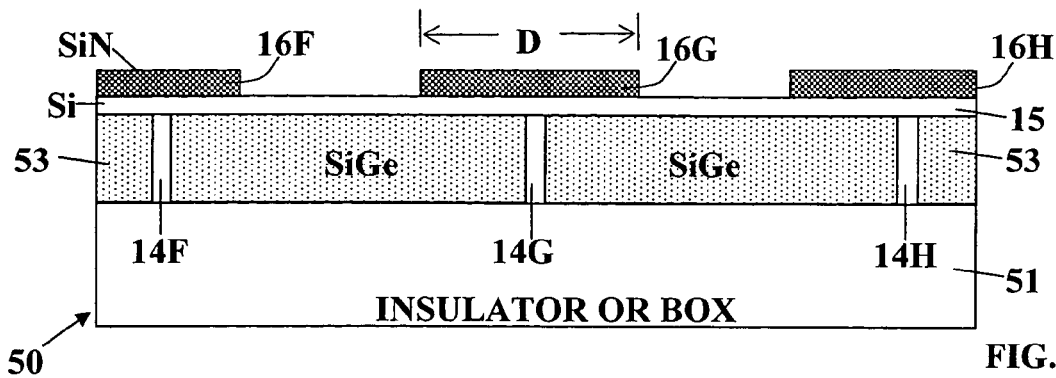

FIG. 6E shows the device 50 of FIG. 6D after formation of three planar fin shaping masks 16F/16G/16H above the thin blanket layer 15 of monocrystalline silicon. The planar fin shaping pads 16F/16G/16H are to be employed for creating the planar fins 15F/15G/15H, as shown in FIG. 4B from the thin blanket layer 15 of monocrystalline silicon. The planar fin shaping pads 16F/16G/16H are preferably composed of a second mask layer preferably composed of silicon nitride and at least mask 16G has a depth D.

Figure 6F:
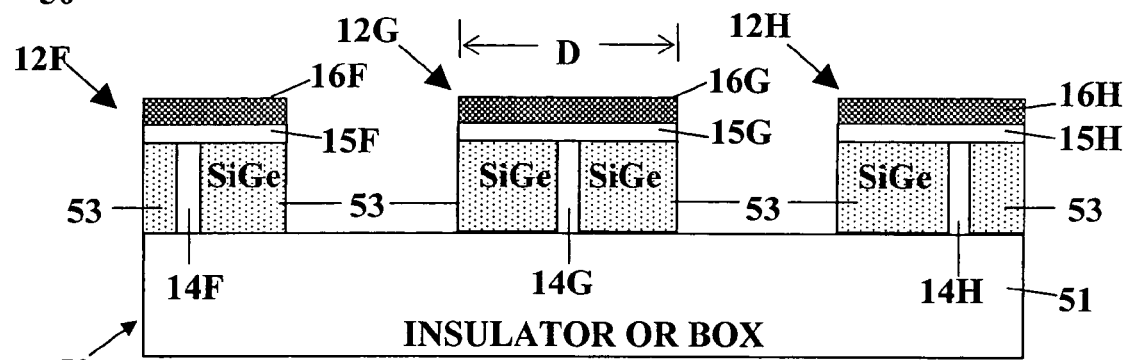

FIG. 6F shows the device 50 of FIG. 6E after anisotropic etching away exposed portions of the silicon layer 15 and the sacrificial layer 53 therebelow, aside from the three planar fin shaping pads 16F/16G/16H, preferably by a Reactive Ion Etching (RIE) process. The portions of the sacrificial layer 53 protected by the planar fin shaping pads 16F/16G/16H remains intact beneath therebelow.

Figure 6G:
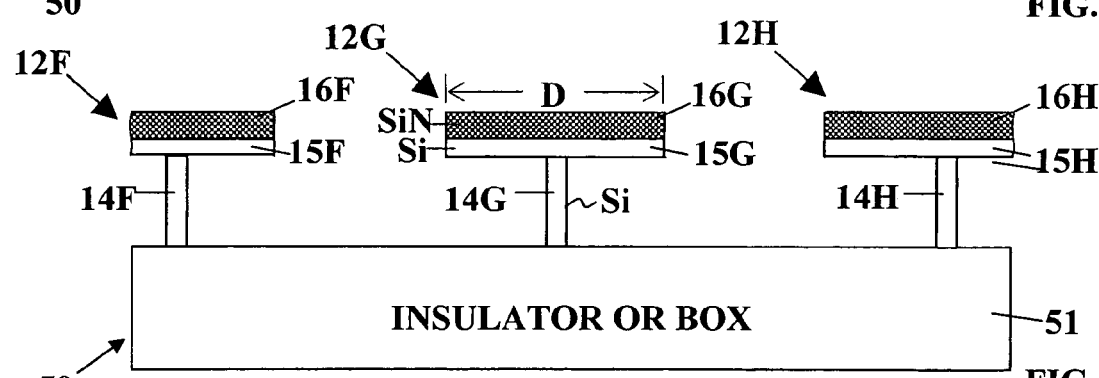
Figure 6H:
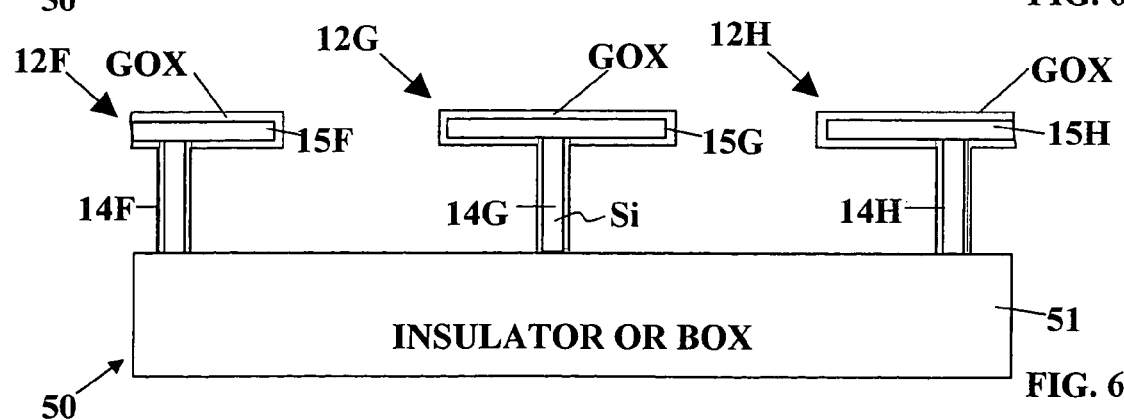

FIG. 6G shows the device 50 of FIG. 6F after isotropic etching of the remainder of the sacrificial layer 53 of SiGe alloy with an etching process selective to Si over SiGe. A preferred process is to use chemical etching with aqueous solution of HHA (hydrogen peroxide ($H_2O_2$), Hydrogen fluoride (HF) and acetic acid ($CH_3COOH$) in a ratio of from 1:2:3 to 2:1:3). The HHA solution is highly selective to Silicon and can etch SiGe up to 300 times faster than silicon as described in U.S. Pat. No 6,642,536 of Xiang et al. for "Hybrid Silicon on Insulator/Bulk Strained Silicon Technology". See also U.S. Pat. No. 6,249,061 of Rim for "Method to Fabricate Strained Si CMOS Structure Using Selective Epitaxial Deposition of Si after Device Isolation Formation". U.S. Pat. No. 6,583,015 of Fitzgerald et al. for "Fate Technology for Strained Surface Channel and Strained Buried Channel MOSFET Devices" states that "at high pressures (>200 mT) and low powers, $CF_4$ dry etch chemistries will etch residual SiGe films with high selectivity to Si. Mixtures of hydrofluoric acid (HF), hydrogen peroxide ($H_2O_2$), and acetic acid ($CH_3COOH$) will also selectively etch relaxed SiGe layers over Si at selectivities of 300:1 or more."

FIG. 6H shows the device 50 of FIG. 6G after stripping away the three planar fin shaping pads 16F/16G/16H. The manufacture of the homogeneous T-Fin FET device 50 includes the standard processing for doping of the T-Fins of channels 12F/12G/12H. The epitaxial silicon which was preferably undoped is doped at this point by ion-implantation. The following step is to form a thin film gate oxide layer GOX covering the exterior surfaces of the vertical/planar fins 14F/15F, 14G/15G, 14H/15H in preparation for formation of the gate electrode 59 which will be formed straddling portions of the T-Fins 12F/12G/12H as shown in FIG. 5B. As will be well understood by those skilled in the art, S/D and extension doping is done after gate patterning.

The dopants are implanted as in a normal FET process. Well implants can be done prior to gate formation. Angled well implants should be done to dope the vertical part of the fin. Extension and halo implants can be done after the gate formation. Again angled implants are needed to dope the vertical part of the fin. S/D implants can be done after a spacer is formed around the gate electrode.

Figure 6I:
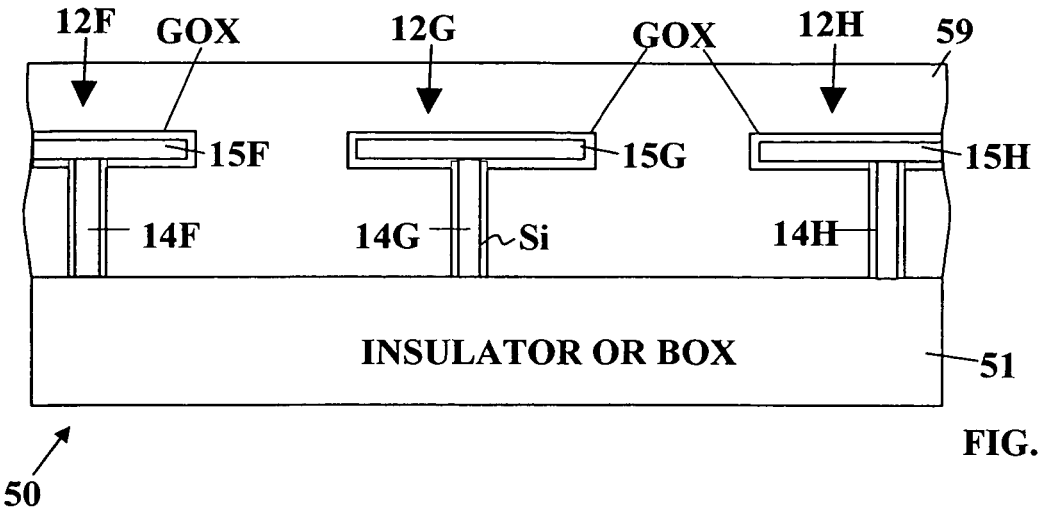

FIG. 6I shows the device 50 of FIG. 6H after the gate electrode 59 has been formed straddling the T-fins 14F/15F, 14G/15G, 14H/15H, comprising the channels of device 50 which are separated from the gate electrode 59 by the gate oxide layer GOX which is a dielectric layer providing electrical isolation of the gate electrode from the channels.

Other processing follows as will be well understood by those skilled in the art.

Second Embodiment

Double Gates have been proposed before but previous approaches have involved back gates using the laser melt process described in U.S. Pat. No. 6,391,695 of Yu for "Double-Gate Transistor Formed in a Thermal Process" or using multi-layered SOI films as described in U.S. Pat. No. 6,352,872 of Kim et al. for "SOI Device with Double Gate and Method for Fabricating the Same" and patterning.

In the case of this invention, the idea of using undercut in SOI systems is refined and extended to thin Si double gate devices.

Figure 7:
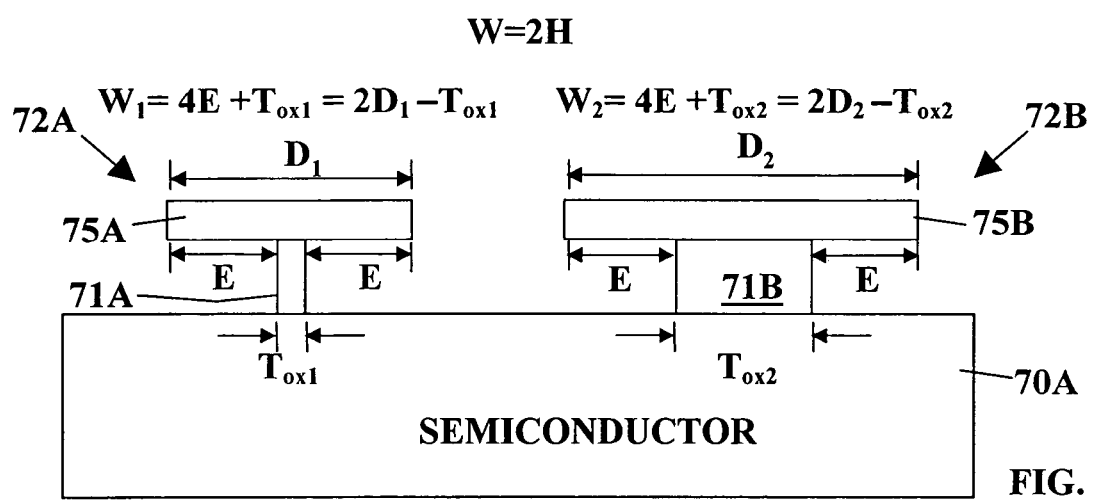
FIG. 7 illustrates a hypothetical T-Fin FET devices formed by employing a direct extension of a standard undercut process which has some inherent problems of etch controllability and dimensional control in which a BOX layer covered by planar silicon fins with different depths $D_1$ and $D_2$. The planar silicon films have been used as masks while the BOX layer has been undercut by etching to form patterned T-fins composed of planar silicon fins above vertical BOX fins formed above a semiconductor substrate.

FIG. 7 illustrate the result of using a hypothetical process which presents some inherent problems with formation of a T-Fin FET device 70 which employs a direct extension of a standard undercut process. In FIG. 7, a partially completed T-Fin FET device 70 is shown with the two T-Fins 72A/72B formed on the semiconductor substrate 70A. The first T-fin 72A has a narrow planar silicon fin 75A with a depth $D_1$ and a vertical fin 74A formed from a blanket BOX layer(not shown) with a thickness $T_{ox1}$. The second T-fin 72B has wider planar silicon T-fin 75B with a depth $D_2$ and a wider vertical fin 74B which is also formed from the BOX layer with a thickness $T_{ox2}$. The vertical fins 71A/71B have been formed by removal of unprotected portions of the BOX layer by undercutting below the planar fins 75A/75B by an equal dimension E.

The embodiment of FIG. 7 illustrates the inherent problems with the hypothetical process, which relate to etch controllability and dimensional control. FIG. 7 shows two vertical fins 71A/71B which were formed by etching the blanket BOX layer using the planar silicon fins 75A/75B as masks. The etching process forms undercuts with a width E on the sides of the vertical BOX fins 71A/71B. Since the undercut is E regardless of the different depths $D_1$ and $D_2$ of the planar silicon fins 75A/75D, the thickness of the vertical fin 71A is only $T_{ox1}$ whereas the thickness of the vertical fin 71B is $T_{ox2}$ which is much greater. Thus, the patterned T-fins 72A/72B are composed of planar silicon fins above vertical BOX fins 71A/71B formed above a semiconductor substrate 70A.

There is a first problem with the undercut process shown in FIG. 7 in that extending the BOX undercut approach to double gates has shortcomings. In particular, the undercut E is constant for any device dimension D and therefore requires greater "D" undercut for the same width W than if it were not. Overetching can be done, but only with multiple masks for each width. Otherwise the smallest D will have lift-off. Referring again to FIG. 7, the etch distance undercut E is constant for any gate lithographic dimension D. For example, as shown in FIG. 7

$$W_1 = 4E + T_{ox1} = 2D_1 - T_{ox1}$$

$$W_2 = 4E + T_{ox2} = 2D_2 - T_{ox2}$$

A second problem with the undercut process shown in FIG. 7 is that etch controllability is an issue since the unwanted result of the etching process is that corners formed from etching silicon oxide will be rounded and the problem is that the rounding will limit the shortest width.

The New Structure

Figure 8:
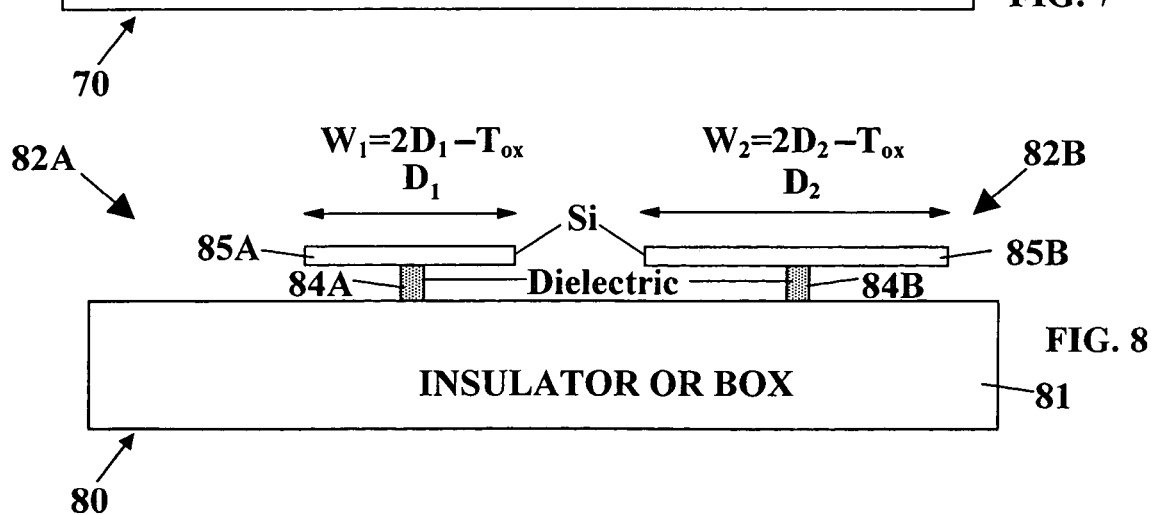
FIG. 8 shows heterogeneous T-Fin devices produced as the result of performing an etch undercut in combination with the use of a SiN/Si/SiGe/BOX stack that produces the structure seen in FIG. 9B where the undercut is limited by a change in material and not dependent on etch rate controllability.

FIG. 8 shows a heterogeneous T-Fin FET device 80 produced as the result of performing an etch undercut in combination with the use of a SiN/Si/SiGe/BOX (or Si) stack that produces the structure seen in where the undercut is limited by a change in material and not dependent on etch rate controllability. In FIG. 8, a partially completed heterogeneous T-Fin FET device 80 is shown with the two T-Fin channels 82A/82B formed on the BOX substrate 81. The first T-fin channel 82A has a narrow planar silicon fin 85A with a depth $D_1$ and a thin vertical fin 84A composed of a material selected from silicon oxide and silicon nitride with a narrow thickness $T_{ox}$. The second T-fin channel 82B has wider planar silicon T-fin 85B with a depth $D_2$ and a narrow vertical fin 84B which is also composed of a material selected from silicon oxide and silicon nitride with the same narrow thickness $T_{ox}$. The vertical fins 84A/84B have been formed by removal of SiGe by undercutting below the planar fins 85A/85B by unequal dimensions in this case so that $W_1=2D_1-T_{ox}$ and $W_2=2D_2-T_{ox}$.

Figure 9A:
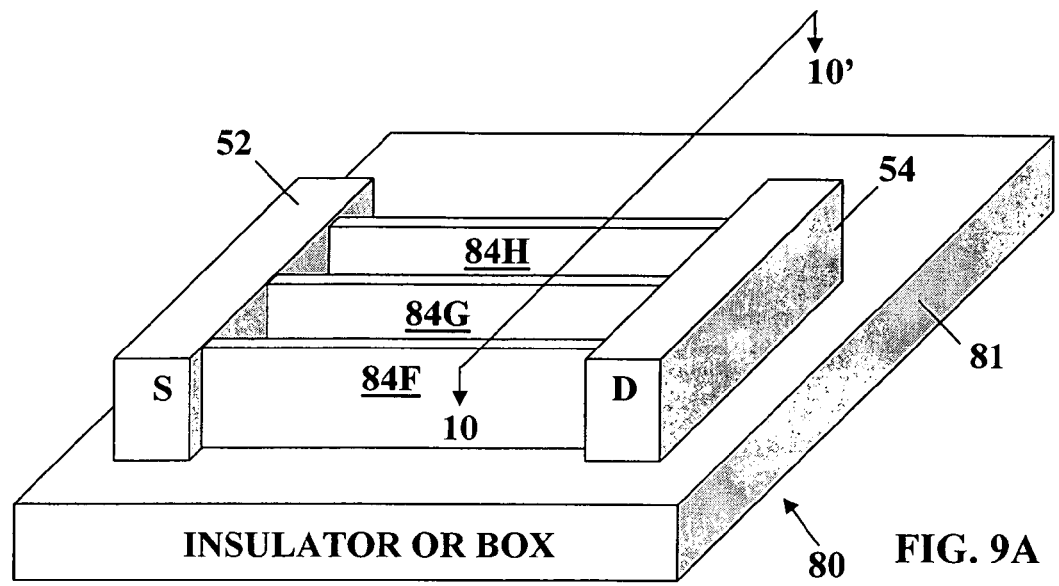
FIG. 9A shows a cut-away perspective view of a portion of a heterogeneous T-Fin FET device with three vertical fins composed of an insulating material arranged in parallel between the source/drain islands on the substrate with the gate electrode and the three corresponding planar fins removed for purposes of showing the arrangement of the three vertical fins.

FIG. 9A shows a cut-away perspective view of a portion of a heterogeneous T-Fin FET device 80 with three vertical fins 84F, 84G, and 84H composed of an insulating material such as silicon oxide and silicon nitride arranged in parallel between the source/drain islands 52/54 on the insulator or BOX substrate 81 with the gate electrode 89 (shown in FIG. 9B) and the three corresponding planar fins 85F/85G/85H (shown in FIG. 9B) of the T-fins 82F/82G/82H removed for purposes of showing the arrangement of the three vertical fins 84F/84G/84H.

Figure 9B:
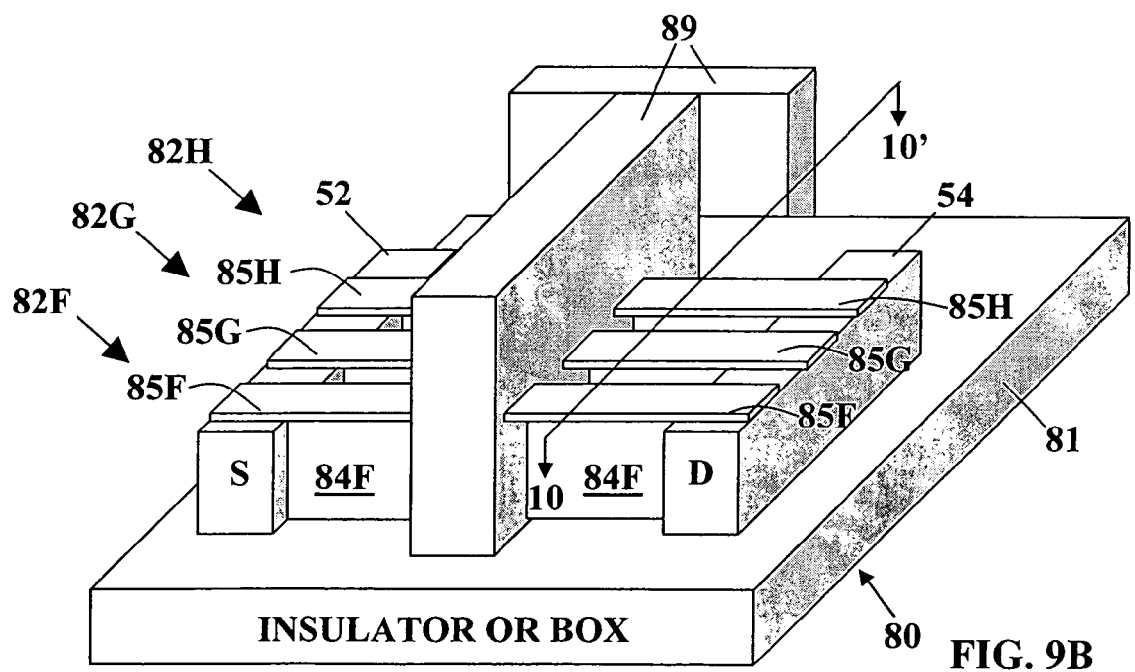
FIG. 9B shows a perspective view of the heterogeneous T-Fin FET device of FIG. 9A with the completed set of three T-fins arranged in parallel and with the gate electrode in place straddling the three sets of heterogeneous T-fins.
Figure 9A:
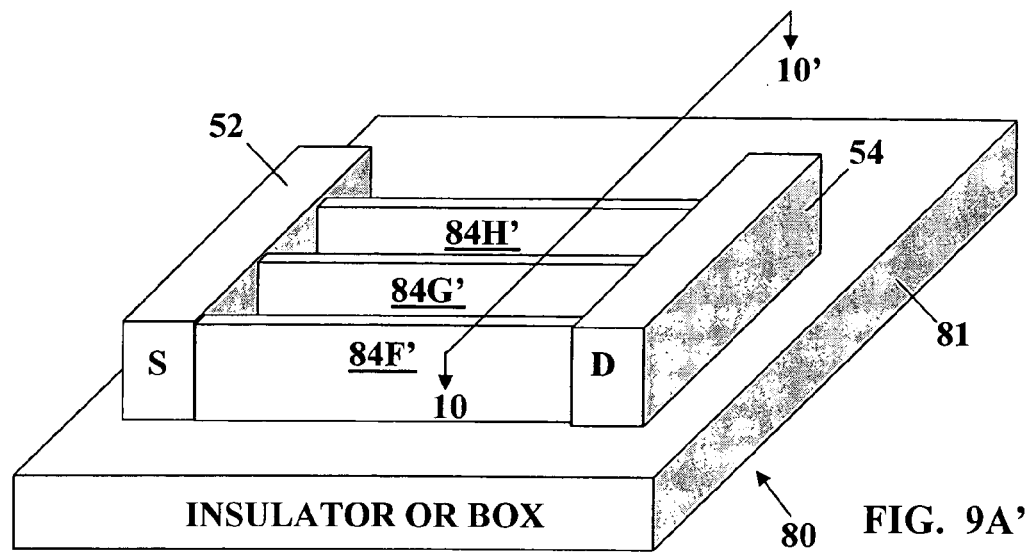
Figure 9B:
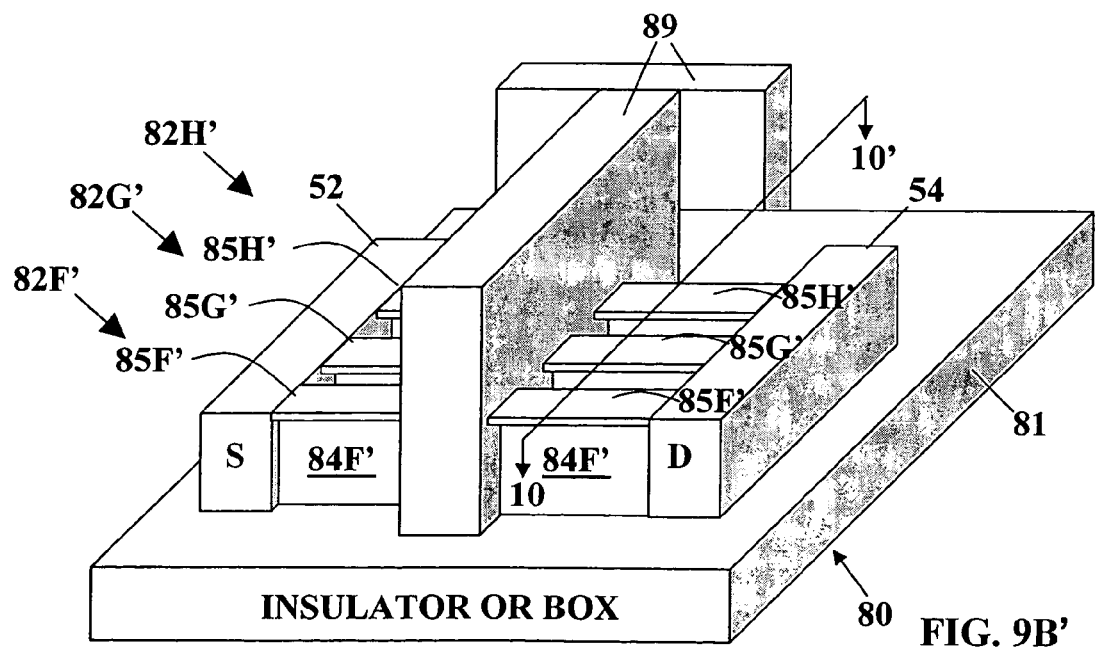

FIG. 9B shows a perspective view of the heterogeneous T-Fin FET device 80 of FIG. 9A with the completed set of three T-fins 82F/82G/82H arranged in parallel and with the gate electrode 89 in place straddling the three sets of T-fins 82F/82G/82H.

FIGS. 9A'–9B' show an alternative to the configuration shown in FIGS. 9–9B with the planar fins 85F'/85G'/85H' reaching to the sidewalls of the source/drain islands 52/54 and the vertical fins 84F'/84G'/84H' recessed by the thickness of the planar fins 85F'/85G'/85H'.

In accordance with this aspect of the invention a double gate device with well controlled widths W is provided.

Advantages (i) Controllability of etching undercut is not an issue since the etching process terminates on a different material which is resistant to the etchant employed;

(ii) The process facilitates the maximum double gate width which is feasible;

(iii) The Si thickness is well controlled here which is different from a conventional FinFET;

(iv) Variation in the width of silicon oxide and silicon nitride is minimized;

(v) This process is not limited to SOI substrates. One can use a bulk substrate with Si/SiGe/Si that can have etch selectivity also;

(vi) Standard lithographic processes facilitate multiple widths through D1 and D2 control compared to the width quantification problems of FinFETs.

Processing Steps

FIGS. 10A–10H are sectional views which illustrate a preferred method of manufacture of the heterogeneous T-Fin FET device 80 shown in FIG. 9B.

Figure 10A:
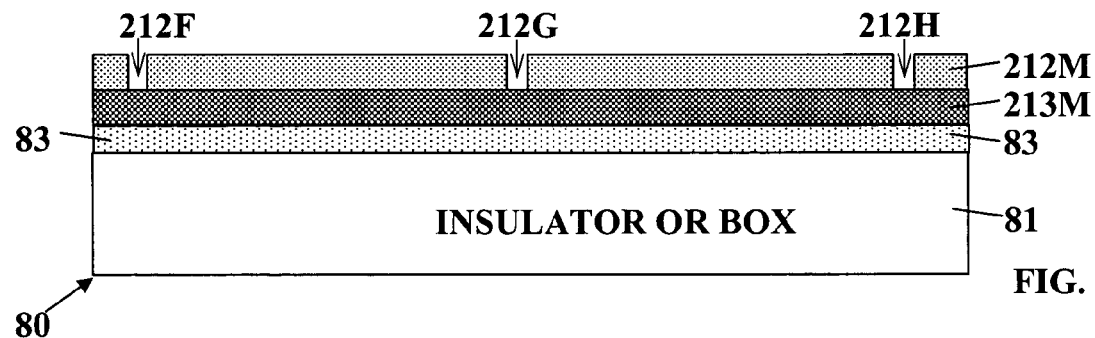
FIGS. 10A–10H are sectional views which illustrate a preferred method of manufacture of the heterogeneous T-Fin FET device 80 shown in FIG. 9B.

FIG. 10A shows a sectional view taken along line 10–10' in FIG. 9B of the heterogeneous T-Fin FET device 80, which is fabricated on a substrate 81, which is preferably composed of an insulator or Buried Oxide (BOX) layer. A thin, blanket, conformal, sacrificial layer 83 of a SiGe alloy has been formed over the top, planar, horizontal surface of the substrate 81 by a process as described above. The sacrificial SiGe layer 83 preferably has a composition from about 5 atomic % to about 30 atomic % germanium (Ge); and it preferably has a thickness from about 5 nm to about 100 nm.

A blanket, conformal, first mask 213M preferably comprising a layer of silicon nitride has been formed over the blanket sacrificial SiGe layer 83. A photoresist mask 212M patterned with vertical-fin window patterns 212F, 212G and 212H with typical widths of 10–20 nm extending therethrough has been formed on the top surface of the first mask 213M and the vertical-fin window patterns 213F, 213G and 213H have been etched through the first mask 213M to expose the top surface of the sacrificial layer 83 therebelow.

Figure 10B:
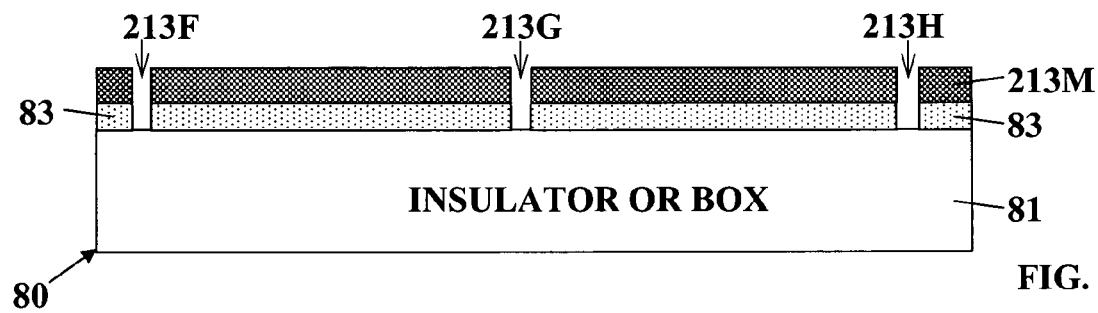

FIG. 10B shows the heterogeneous T-Fin FET device 80 of FIG. 10A after the photoresist mask 212M was stripped and the patterned openings comprising the vertical-fin window patterns 212F, 212G and 212H (previously etched through the first mask 213M) were used to etch vertical fin windows 213F, 213G and 213H through the sacrificial layer 83 down to the top, planar, horizontal surface of the substrate 81.

Figure 10C:
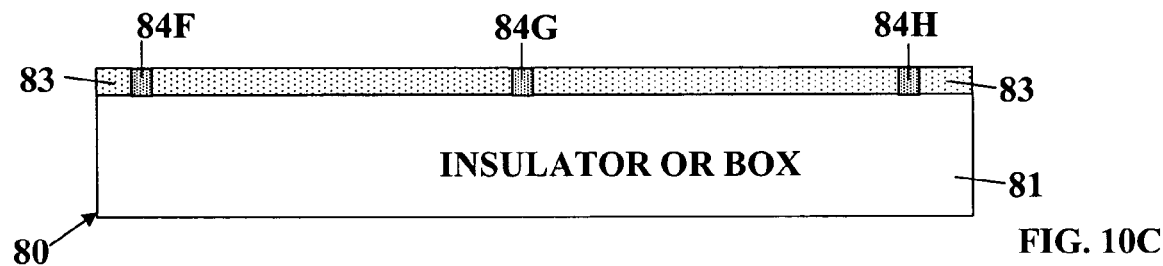

FIG. 10C shows the heterogeneous T-Fin FET device 80 of FIG. 10B after a process of deposition of vertical fin insulating material 84 to form the thin vertical fins 84F/84G/84H composed of an insulator such as silicon oxide or silicon nitride filling the vertical fin windows 213F, 213G and 213H followed by polishing down the excess insulator 84 to the surface of the sacrificial layer 83 by Chemical Mechanical Planarization (CMP). The thin insulating vertical fins 84F/84G/84H are formed on the exposed top, horizontal surface of the substrate 81 within the windows 213F/213G/213H in the sacrificial layer 83 composed of SiGe, in much the same way as the fin shown in the previous embodiment described with respect to FIG. 4B.

Figure 10D:
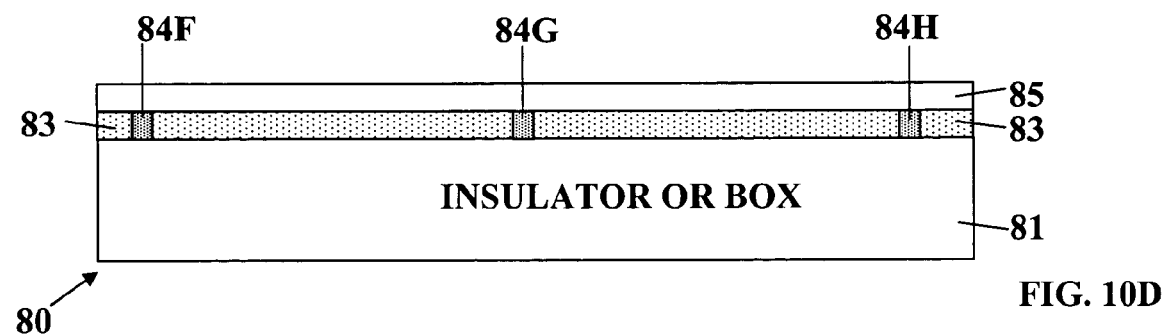

FIG. 10D shows the heterogeneous T-Fin FET device 80 of FIG. 10C after epitaxial deposition of silicon (Si) to form a blanket, thin layer of silicon 85 on the surface of the sacrificial layer 83 (as well as the source/drain islands 52/54 connected thereto, but not shown). As in the case of the vertical fins 84F/84G/84H, the silicon layer 85 is a strained monocrystalline silicon layer as the result of employing the epitaxial deposition process over the monocrystalline SiGe layer. If the vertical insulator fins 84F/84G/84H are sufficiently narrow, the growth of the silicon 85 is continuous and substantially planar as it bridges the gap thereacross.

Figure 10E:
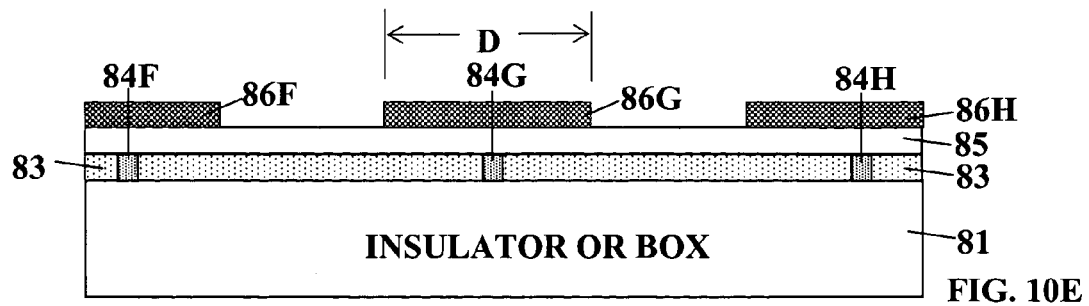

FIG. 10E shows the heterogeneous T-Fin FET device 80 of FIG. 10D after formation of three planar fin shaping masks 86F/86G/86H above the thin blanket layer 85 of monocrystalline silicon. The planar fin shaping pads 86F/86G/86H are to be employed for creating the planar fins 85F/85G/85H, as shown in FIG. 9B from the thin blanket layer 85 of monocrystalline silicon. The planar fin shaping pads 86F/86G/86H are preferably composed of a second mask layer preferably composed of silicon nitride and at least mask 86G has a depth D.

Figure 10F:
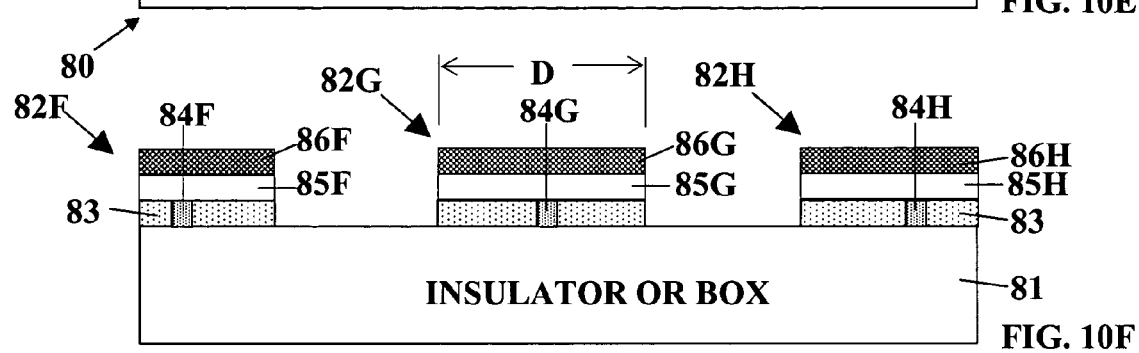

FIG. 10F shows the heterogeneous T-Fin FET device 80 of FIG. 10E after anisotropic etching away exposed portions of the silicon layer 85 and the sacrificial layer 83 therebelow, aside from the three planar fin shaping pads 86F/86G/86H, preferably by a Reactive Ion Etching (RIE) process. The portions of the sacrificial layer 83 protected by the planar fin shaping pads 86F/86G/86H remains intact therebelow. At this point the T-fins 82F/82G/82H have been formed including the three planar silicon fins 85F/85G/85H and the three vertical fins 84F/84G/84H composed of the insulating material, with the remainder of the sacrificial layer 83 remaining at this point in the process and with the planar fin shaping pads 86F/86G/86H remaining above the three planar silicon fins 85F/85G/85H.

Figure 10G:
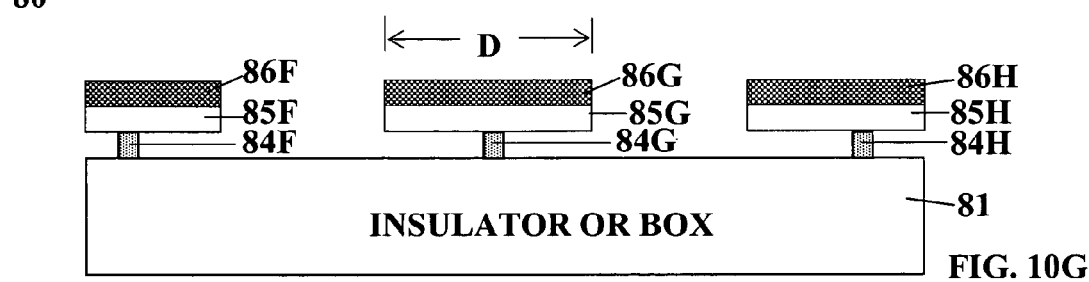

FIG. 10G shows the heterogeneous T-Fin FET device 80 of FIG. 10F after isotropically etching away the remainder of the sacrificial layer 83 of SiGe alloy with an etching process selective to Si over SiGe. A preferred process is to use chemical etching with aqueous solution of HHA (hydrogen peroxide ($H_2O_2$), Hydrogen fluoride (HF) and acetic acid ($CH_3COOH$) in a ratio of from 1:2:3 to 2:1:3). The HHA solution is highly selective to Silicon and can etch SiGe up to 300 times faster than silicon as described in U.S.

Pat. No 6,642,536 of Xiang et al. for "Hybrid Silicon on Insulator/Bulk Strained Silicon Technology".

See also U.S. Pat. No. 6,249,061 of Rim for "Method to Fabricate Strained Si CMOS Structure Using Selective Epitaxial Deposition of Si After Device Isolation Formation". U.S. Pat. No. 6,583,015 of Fitzgerald et al. for "Fate Technology for Strained Surface Channel and Strained Buried Channel MOSFET Devices" states that "at high pressures (>200 mT) and low powers, $CF_4$ dry etch chemistries will etch residual SiGe films with high selectivity to Si. Mixtures of hydrofluoric acid (HF), hydrogen peroxide ($H_2O_2$), and acetic acid ($CH_3COOH$) will also selectively etch relaxed SiGe layers over Si at selectivities of 300:1 or more."

Figure 10H:
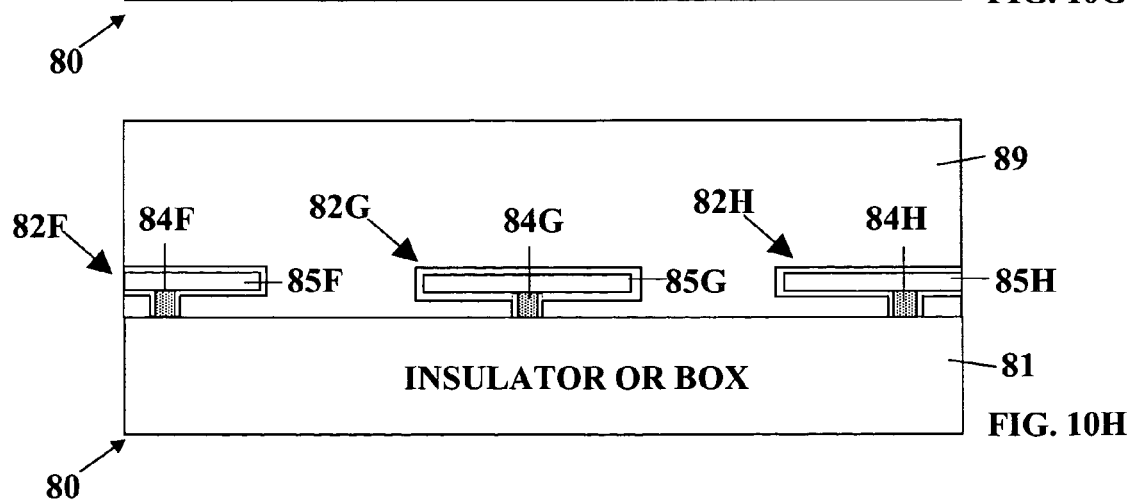

FIG. 10H shows the heterogeneous T-Fin FET device 80 of FIG. 10G after stripping of the three planar fin shaping masks 86F/86G/86H. Then the epitaxial silicon which was preferably undoped is doped at this point by ion-implantation. Then follows formation of a thin film gate oxide layer GOX covering the exterior surfaces of the exposed surfaces of the T-Fins 82F/82G/82H, followed by formation of the gate electrode 89 which was formed straddling portions of the T-Fins 82F/82G/82H as shown in FIG. 9B. The gate electrode 89 straddles the T-fins 82F/82G/82H, comprising the channels of device 80 which are separated from the gate electrode 89 by the gate oxide layer GOX which is a dielectric layer providing electrical isolation of the gate electrode from the channels.

The dopants are implanted as in a normal FET process. Well implants can be done prior to gate formation. Extension and halo implants can be done after the gate formation. S/D implants can be done after a spacer is formed around the gate electrode.

The manufacture of the heterogeneous T-Fin FET device 80 of FIG. 10H includes other standard processing steps as will be well understood by those skilled in the art.

An alternative material to SiGe for the sacrificial layer where the fins are composed of Si comprises SiC. Instead of forming the T-Fin of silicon, germanium or SiGe can be used as a fin and S/D material. In that case it is preferred that the sacrificial layer is composed of Si or SiC.

While the invention has been described with reference to specific embodiments, those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims, which follow.

What is claimed is:

1. A method of fabricating an FET device comprising the steps of:
    forming a semiconductor structure comprising a source region, a drain region over a horizontal surface of a substrate comprising an insulating material;
    forming a channel structure over the horizontal surface of the substrate connecting between the drain region and the source region, with the channel structure comprising a horizontally oriented, planar fin composed of a semiconductor material, with the planar fin being formed above a vertical fin, with the vertical fin being composed of a material selected from the group consisting of a semiconductor material and an insulating material, with the planar fin and the vertical fin having a T-shaped cross-section, the vertical fin having a proximal edge and a distal edge, with the proximal edge in contact with the horizontal surface of the substrate and with the planar fin in contact with the distal edge of the vertical fin;
    forming a gate dielectric layer over exposed surfaces of the channel structure; and
    forming a gate electrode straddling the channel gate dielectric and the channel structure.

2. The method of claim 1 wherein the vertical fin is composed of a semiconductor material selected from the group consisting of Ge and SiGe.

3. The method of claim 1 wherein the vertical fin is composed of an insulating material selected from the group consisting of silicon oxide and silicon nitride.

4. The method of claim 1 including the steps as follows:
    forming a sacrificial layer over the horizontal surface of the substrate prior to forming the channel structure;
    forming a patterned window extending through the sacrificial layer down to the horizontal surface of the substrate for shaping the vertical fin of the channel structure;
    depositing a semiconductor layer filling the patterned window to form the vertical fin of the channel structure and forming a blanket semiconductor layer covering the sacrificial layer;
    forming a channel mask over the blanket semiconductor layer aligned with the vertical fin of the channel structure;
    etching away portions of the blanket semiconductor layer aside from the channel mask to form the planar fin;
    whereby the channel structure comprises the vertical fin and the planar fin.

5. The method of claim 4 wherein the vertical fin and the planar fin are both composed of silicon.

6. The method of claim 4 wherein the vertical fin and the planar fin are both composed of a material selected from the group consisting of Ge and SiGe.

7. The method of claim 4 wherein:
    the semiconductor material comprises silicon (Si); and
    the sacrificial layer comprises silicon-germanium (SiGe).

8. The method of claim 4 wherein:
    the semiconductor material comprises a material selected from Ge and SiGe; and
    the sacrificial layer comprises a material selected from the group consisting of silicon (Si) and SIC.

9. The method of claim 1 including the steps as follows:
    forming a sacrificial layer over the horizontal surface of the substrate prior to forming the channel structure;
    forming a patterned window extending through the sacrificial layer down to the horizontal surface of the substrate for shaping the vertical fin of the channel structure;
    depositing a dielectric layer filling the patterned window to form the vertical fin of the channel structure and forming a blanket semiconductor layer covering the sacrificial layer;
    forming a channel mask over the blanket semiconductor layer aligned with the vertical fin of the channel structure;
    etching away portions of the blanket semiconductor layer aside from the channel mask to form the planar fin;
    whereby the channel structure comprises the vertical dielectric fin and the planar semiconductor fin.

10. The method of claim 9 wherein the planar fin is composed of a material selected from the group consisting of silicon (Si), germanium (Ge) and SiGe.

11. The method of claim 9 wherein the planar fin is composed of silicon (Si) and the sacrificial layer is composed of SiGe.

12. The method of claim 9 wherein the planar fin is composed of SiGe and the sacrificial layer is composed of a material selected from the group consisting of silicon (Si) and SiC.

13. The method of claim 9 wherein the vertical fin is composed of a material selected from the group consisting of silicon dioxide and silicon nitride.

14. An FET device comprising:
 a semiconductor structure comprising a source region, a drain region over a horizontal surface of a substrate comprising an insulating material;
 a channel structure over the horizontal surface of the substrate connecting between the drain region and the source region, with the channel structure comprising a horizontally oriented, planar fin composed of a semiconductor material, with the planar semiconductor channel fin being positioned above a vertical fin, with the vertical fin being composed of a material selected from the group consisting of a semiconductor material and an insulating material, with the planar fin and the vertical fin having a T-shaped cross-section, the vertical fin having a proximal edge and a distal edge, with the proximal edge in contact with the horizontal surface of the substrate and with the planar fin in contact with the distal edge of the vertical fin;
 a gate dielectric layer over exposed surfaces of the channel structure; and
 a gate electrode straddling the channel gate dielectric and the channel structure.

15. The FET device of claim 14 wherein the channel structure comprises the vertical fin and the planar fin both composed of a semiconductor material.

16. The FET device of claim 14 wherein the channel structure comprises the vertical fin composed of an insulating material selected from the group consisting of silicon oxide and silicon nitride and the planar fin composed of a semiconductor material selected from the group consisting of silicon (Si), germanium (Ge) and SiGe.

17. The FET device of claim 14 wherein the vertical fin and the planar fin are both composed of silicon.

18. The FET device of claim 14 wherein the vertical fin and the planar fin are both composed of a material selected from Ge and SiGe.

19. The FET device of claim 14 wherein the vertical fin is composed of a dielectric and the planar fin is composed of a material selected from the group consisting of silicon (Si), germanium (Ge) and SiGe.

20. The FET device of claim 14 wherein the vertical fin is composed of a dielectric and the planar fin is composed of silicon (Si).

* * * * *